US007469831B2

(12) United States Patent
Gu et al.

(10) Patent No.: US 7,469,831 B2
(45) Date of Patent: Dec. 30, 2008

(54) LASER-BASED METHOD AND SYSTEM FOR PROCESSING TARGETED SURFACE MATERIAL AND ARTICLE PRODUCED THEREBY

(75) Inventors: Bo Gu, North Andover, MA (US); Jonathan S. Ehrmann, Sudbury, MA (US); Donald J. Svetkoff, Ann Arbor, MI (US); Steven P. Cahill, Newton, MA (US); Kevin E. Sullivan, Everett, MA (US)

(73) Assignee: GSI Group Corporation, Billerica, MA (US)

( * ) Notice: Subject to any disclaimer, the term of this patent is extended or adjusted under 35 U.S.C. 154(b) by 0 days.

(21) Appl. No.: 11/514,660

(22) Filed: Oct. 27, 2006

(65) Prior Publication Data
US 2008/0011852 A1 Jan. 17, 2008

Related U.S. Application Data

(62) Division of application No. 11/152,509, filed on Jun. 14, 2005.

(60) Provisional application No. 60/584,268, filed on Jun. 30, 2004.

(51) Int. Cl.
*G06K 7/10* (2006.01)
(52) U.S. Cl. .................. 235/454; 219/121.62; 438/463
(58) Field of Classification Search ................. 235/454; 372/25; 347/173; 219/121.62, 121.68, 121.69
See application file for complete search history.

(56) References Cited

U.S. PATENT DOCUMENTS

| | | | |
|---|---|---|---|
| 3,763,454 A | 10/1973 | Zandonatti | |
| 4,399,345 A | 8/1983 | Lapham | |
| 4,406,939 A | 9/1983 | Golker | |

(Continued)

FOREIGN PATENT DOCUMENTS

DE        2918100        11/1980

(Continued)

OTHER PUBLICATIONS

Her, Tsing-Hua, et al., Microstructuring of Silicon With Femtosecond Laser Pulses, American Institute of Physics, S0003-6951, 01238-8, Jul. 17, 1998, pp. 1673-1675.

(Continued)

*Primary Examiner*—Daniel A Hess
(74) *Attorney, Agent, or Firm*—Brooks Kushman P.C.

(57) ABSTRACT

A laser-based method and system for processing targeted surface material and article produced thereby are provided. The system processes the targeted surface material within a region of a workpiece while avoiding undesirable changes to adjacent non-targeted material. The system includes a primary laser subsystem including a primary laser source for generating a pulsed laser output including at least one pulse having a wavelength and a pulse width less than 1 ns. A delivery subsystem irradiates the targeted surface material of the workpiece with the pulsed laser output including the at least one pulse to texture the targeted surface material. The pulsed laser output has sufficient total fluence to initiate ablation within at least a portion of the targeted surface material and the pulse width is short enough such that the region and the non-targeted material surrounding the material are substantially free of slag.

100 Claims, 16 Drawing Sheets

U.S. PATENT DOCUMENTS

| | | | |
|---|---|---|---|
| 4,423,401 A | 12/1983 | Mueller | |
| 4,483,005 A | 11/1984 | Smart | |
| 4,522,656 A | 6/1985 | Kuhn-Kuhnenfeld | |
| 4,532,402 A | 7/1985 | Overbeck | |
| 4,584,773 A | 4/1986 | Rieder et al. | |
| 4,594,263 A | 6/1986 | Folk et al. | |
| 4,628,609 A | 12/1986 | Rieder et al. | |
| 4,716,292 A | 12/1987 | Rieder et al. | |
| 4,826,785 A | 5/1989 | McClure et al. | |
| 4,867,568 A | 9/1989 | Heinz et al. | |
| 4,926,566 A | 5/1990 | McMurtry et al. | |
| 4,932,131 A | 6/1990 | McMurtry | |
| 4,935,801 A | 6/1990 | McClure et al. | |
| 5,033,817 A | 7/1991 | Stephens | |
| 5,058,856 A | 10/1991 | Gordon et al. | |
| 5,059,764 A * | 10/1991 | Baer | 219/121.68 |
| 5,064,290 A | 11/1991 | McMurtry et al. | |
| 5,208,437 A | 5/1993 | Miyauchi et al. | |
| 5,265,114 A | 11/1993 | Sun | |
| 5,300,756 A | 4/1994 | Cordingley | |
| 5,400,350 A | 3/1995 | Galvanauskas | |
| 5,460,034 A | 10/1995 | Herrick | |
| 5,473,624 A | 12/1995 | Sun | |
| 5,537,276 A | 7/1996 | Mukae et al. | |
| 5,630,979 A | 5/1997 | Welz et al. | |
| 5,632,916 A | 5/1997 | Lappalainen et al. | |
| 5,656,186 A | 8/1997 | Mourou et al. | |
| 5,696,782 A | 12/1997 | Harter et al. | |
| 5,701,319 A | 12/1997 | Fermann | |
| 5,703,341 A | 12/1997 | Lowndes et al. | |
| 5,722,989 A | 3/1998 | Fitch et al. | |
| 5,808,268 A | 9/1998 | Balz et al. | |
| 5,812,569 A | 9/1998 | Walker et al. | |
| 5,818,630 A | 10/1998 | Fermann | |
| 5,867,305 A | 2/1999 | Waarts et al. | |
| 5,933,271 A | 8/1999 | Waarts et al. | |
| 5,979,238 A | 11/1999 | Boege et al. | |
| 5,998,759 A | 12/1999 | Smart | |
| 6,025,256 A | 2/2000 | Swenson et al. | |
| 6,057,180 A | 5/2000 | Sun | |
| 6,114,118 A | 9/2000 | Templeton | |
| 6,144,118 A | 11/2000 | Cahill et al. | |
| 6,160,568 A | 12/2000 | Brodsky et al. | |
| 6,172,325 B1 | 1/2001 | Baird et al. | |
| 6,181,463 B1 | 1/2001 | Galvanauskas et al. | |
| 6,181,728 B1 | 1/2001 | Cordingley et al. | |
| 6,191,486 B1 | 2/2001 | Bernstein | |
| 6,198,568 B1 | 3/2001 | Galvanauskas | |
| 6,208,458 B1 | 3/2001 | Galvanauskas et al. | |
| 6,212,310 B1 | 4/2001 | Waarts et al. | |
| 6,239,406 B1 | 5/2001 | Onoma et al. | |
| 6,275,250 B1 | 8/2001 | Sanders et al. | |
| 6,275,632 B1 | 8/2001 | Waarts et al. | |
| 6,281,471 B1 | 8/2001 | Smart | |
| 6,285,002 B1 | 9/2001 | Ngoi et al. | |
| 6,286,586 B2 | 9/2001 | Cook | |
| 6,297,541 B1 | 10/2001 | Ema et al. | |
| 6,298,187 B1 | 10/2001 | Waarts et al. | |
| 6,300,590 B1 | 10/2001 | Lauer et al. | |
| 6,333,485 B1 | 12/2001 | Haight et al. | |
| 6,339,604 B1 | 1/2002 | Smart et al. | |
| 6,340,806 B1 | 1/2002 | Smart et al. | |
| 6,341,029 B1 | 1/2002 | Fillion | |
| 6,411,323 B1 | 6/2002 | Waarts et al. | |
| 6,423,613 B1 | 7/2002 | Geusic | |
| 6,423,935 B1 | 7/2002 | Hackel et al. | |
| 6,442,861 B1 | 9/2002 | Boge et al. | |
| 6,472,295 B1 | 10/2002 | Morris et al. | |
| 6,483,071 B1 | 11/2002 | Hunter et al. | |
| 6,489,985 B1 | 12/2002 | Brodsky et al. | |
| 6,495,791 B2 | 12/2002 | Hunter et al. | |
| 6,496,292 B2 | 12/2002 | Fillion | |
| 6,552,301 B2 | 4/2003 | Herman et al. | |
| 6,555,781 B2 | 4/2003 | Ngoi et al. | |
| 6,571,486 B1 | 6/2003 | Tondorf et al. | |
| 6,573,473 B2 | 6/2003 | Hunter et al. | |
| 6,574,250 B2 | 6/2003 | Sun et al. | |
| 6,588,333 B1 | 7/2003 | Homer et al. | |
| 6,596,964 B2 | 7/2003 | Accou | |
| 6,603,136 B1 | 8/2003 | Wagner et al. | |
| 6,603,988 B2 | 8/2003 | Dowlatshahi | |
| 6,604,825 B2 | 8/2003 | Lai | |
| 6,608,666 B2 | 8/2003 | Deguchi et al. | |
| 6,609,297 B1 | 8/2003 | Hiramatsu | |
| 6,610,351 B2 | 8/2003 | Shchegolikhin et al. | |
| 6,610,380 B2 | 8/2003 | Kitaura et al. | |
| 6,611,484 B2 | 8/2003 | Tsukamoto | |
| 6,617,265 B2 | 9/2003 | Tanaka et al. | |
| 6,621,041 B2 | 9/2003 | Hayashi et al. | |
| 6,621,772 B2 | 9/2003 | Asano et al. | |
| 6,631,114 B1 | 10/2003 | Kobayashi | |
| 6,635,846 B1 | 10/2003 | Rieck | |
| 6,636,465 B2 | 10/2003 | Kobayashi | |
| 6,636,477 B1 | 10/2003 | Miyamoto et al. | |
| 6,638,597 B1 | 10/2003 | Shinoda et al. | |
| 6,639,175 B2 | 10/2003 | Rohleder et al. | |
| 6,639,177 B2 | 10/2003 | Ehrmann et al. | |
| 6,640,682 B2 | 11/2003 | Wagner et al. | |
| 6,642,091 B1 | 11/2003 | Tanabe | |
| 6,642,475 B2 | 11/2003 | Benderly | |
| 6,643,082 B1 | 11/2003 | Belser | |
| 6,646,574 B2 | 11/2003 | Maeda et al. | |
| 6,646,967 B1 | 11/2003 | Garcia | |
| 6,647,868 B2 | 11/2003 | Chen | |
| 6,654,327 B2 | 11/2003 | Kobayashi | |
| 6,656,029 B2 | 12/2003 | Kitahata et al. | |
| 6,656,815 B2 | 12/2003 | Coolbaugh et al. | |
| 6,657,734 B1 | 12/2003 | Monz et al. | |
| 6,657,935 B2 | 12/2003 | Eguchi et al. | |
| 6,659,196 B1 | 12/2003 | Anderson | |
| 6,659,853 B1 | 12/2003 | Hergott | |
| 6,660,962 B2 | 12/2003 | McCay et al. | |
| 6,660,964 B1 | 12/2003 | Benderly | |
| 6,661,106 B1 | 12/2003 | Gilmour et al. | |
| 6,661,759 B1 | 12/2003 | Seo | |
| 6,661,761 B2 | 12/2003 | Hayami et al. | |
| 6,662,063 B2 | 12/2003 | Hunter et al. | |
| 6,664,163 B2 | 12/2003 | Fujishima et al. | |
| 6,664,173 B2 | 12/2003 | Doyle et al. | |
| 6,664,174 B2 | 12/2003 | Ema | |
| 6,665,243 B2 | 12/2003 | Kelly et al. | |
| 6,667,253 B2 | 12/2003 | Song et al. | |
| 6,667,792 B2 | 12/2003 | Park | |
| 6,670,222 B1 | 12/2003 | Brodsky | |
| 6,673,692 B2 | 1/2004 | Peterson | |
| 6,674,043 B2 | 1/2004 | Trinks et al. | |
| 6,674,594 B1 | 1/2004 | Wakabayashi et al. | |
| 6,674,702 B2 | 1/2004 | Asada et al. | |
| 6,677,552 B1 | 1/2004 | Tulloch et al. | |
| 6,677,827 B2 | 1/2004 | Jung | |
| 6,679,635 B2 | 1/2004 | Miyamoto et al. | |
| 6,680,121 B2 | 1/2004 | Sakoske et al. | |
| 6,680,241 B2 | 1/2004 | Okamoto et al. | |
| 6,680,458 B2 | 1/2004 | Farmworth | |
| 6,680,888 B2 | 1/2004 | Toda et al. | |
| 6,703,582 B2 | 3/2004 | Smart et al. | |
| 6,709,720 B2 | 3/2004 | Hayakawa et al. | |
| 6,727,458 B2 | 4/2004 | Smart | |
| 6,731,016 B2 | 5/2004 | Peterson | |
| 6,734,387 B2 | 5/2004 | Kafka et al. | |
| 6,762,072 B2 | 7/2004 | Lutz | |
| 6,776,340 B2 | 8/2004 | Murokh et al. | |
| 6,777,645 B2 | 8/2004 | Ehrmann et al. | |
| 6,951,995 B2 | 10/2005 | Couch et al. | |

| | | |
|---|---|---|
| 6,972,268 B2 | 12/2005 | Ehrmann et al. |
| 6,974,207 B2 | 12/2005 | Drummond et al. |
| 6,989,508 B2 | 1/2006 | Ehrmann et al. |
| 7,005,603 B2 | 2/2006 | Addington et al. |
| 7,014,885 B1 | 3/2006 | Pique et al. |
| 7,015,418 B2 | 3/2006 | Cahill et al. |
| 7,027,155 B2 | 4/2006 | Cordingley et al. |
| 7,119,351 B2 | 10/2006 | Woelki |
| 7,148,447 B2 | 12/2006 | Ehrmann et al. |
| 7,176,407 B2 | 2/2007 | Hunter et al. |
| 7,192,846 B2 | 3/2007 | Cordingley et al. |
| 7,358,157 B2 | 4/2008 | Gu et al. |
| 2002/0000313 A1 | 1/2002 | Ku |
| 2002/0003130 A1 | 1/2002 | Sun |
| 2002/0005396 A1 | 1/2002 | Baird |
| 2002/0017662 A1 | 2/2002 | Jeong et al. |
| 2002/0145235 A1 | 10/2002 | Brown et al. |
| 2002/0149136 A1 | 10/2002 | Baird et al. |
| 2002/0162973 A1 | 11/2002 | Cordingley |
| 2002/0167581 A1* | 11/2002 | Cordingley et al. ......... 347/173 |
| 2003/0021324 A1 | 1/2003 | Filgas |
| 2003/0029495 A1 | 2/2003 | Mazur et al. |
| 2003/0039765 A1 | 2/2003 | Hayakawa et al. |
| 2003/0052102 A1 | 3/2003 | Amako et al. |
| 2003/0060910 A1 | 3/2003 | Williams et al. |
| 2003/0071020 A1 | 4/2003 | Hong et al. |
| 2003/0160034 A1 | 8/2003 | Filgas et al. |
| 2003/0161375 A1 | 8/2003 | Filgas |
| 2003/0223678 A1 | 12/2003 | Hunter |
| 2003/0224108 A1 | 12/2003 | Pollara |
| 2003/0224581 A1 | 12/2003 | Lutz et al. |
| 2004/0000540 A1 | 1/2004 | Soboyejo |
| 2004/0046288 A1 | 3/2004 | Chou |
| 2004/0076813 A1 | 4/2004 | Han et al. |
| 2004/0124184 A1 | 7/2004 | An et al. |
| 2004/0134894 A1 | 7/2004 | Gu et al. |
| 2004/0134896 A1 | 7/2004 | Gu et al. |
| 2004/0144760 A1 | 7/2004 | Cahill et al. |
| 2004/0188399 A1 | 9/2004 | Smart |
| 2004/0226925 A1 | 11/2004 | Gu et al. |
| 2005/0029240 A1 | 2/2005 | Dugan et al. |
| 2005/0045586 A1 | 3/2005 | Ellin et al. |
| 2005/0164118 A1 | 7/2005 | Barholm-Hansen |
| 2005/0174042 A1 | 8/2005 | Nishikawa et al. |
| 2005/0199598 A1 | 9/2005 | Hunter et al. |
| 2005/0203225 A1 | 9/2005 | Nakagawa et al. |
| 2005/0218125 A1 | 10/2005 | Addington et al. |
| 2005/0233537 A1 | 10/2005 | Couch et al. |
| 2006/0000814 A1 | 1/2006 | Gu et al. |
| 2006/0028655 A1 | 2/2006 | Cordingley et al. |
| 2006/0079062 A1 | 4/2006 | Mazur et al. |
| 2006/0086702 A1 | 4/2006 | Smart |
| 2006/0108337 A1 | 5/2006 | Gu et al. |
| 2006/0113289 A1 | 6/2006 | Ehrmann et al. |
| 2006/0151704 A1 | 7/2006 | Cordingley |
| 2006/0186096 A1 | 8/2006 | Schramm |
| 2006/0189091 A1 | 8/2006 | Gu |
| 2006/0191884 A1 | 8/2006 | Johnson et al. |
| 2006/0192845 A1 | 8/2006 | Cordingley et al. |
| 2006/0199354 A1 | 9/2006 | Gu |
| 2006/0205121 A1 | 9/2006 | Couch et al. |
| 2006/0207975 A1 | 9/2006 | Ehrmann et al. |
| 2006/0216927 A1 | 9/2006 | Cordingley et al. |
| 2006/0256181 A1 | 11/2006 | Ehrmann et al. |
| 2007/0031993 A1 | 2/2007 | Nemets et al. |
| 2007/0052791 A1 | 3/2007 | Cordingley et al. |
| 2007/0075058 A1 | 4/2007 | Ehrmann et al. |
| 2007/0106416 A1 | 5/2007 | Griffiths et al. |
| 2007/0117227 A1 | 5/2007 | Gu |
| 2007/0173075 A1 | 7/2007 | Lee et al. |
| 2007/0178714 A1 | 8/2007 | Gu et al. |
| 2007/0199927 A1 | 8/2007 | Gu et al. |
| 2007/0215575 A1 | 9/2007 | Gu et al. |
| 2007/0215820 A1 | 9/2007 | Cordingley et al. |
| 2008/0035614 A1 | 2/2008 | Smart |
| 2008/0067155 A1 | 3/2008 | Gu |
| 2008/0073438 A1 | 3/2008 | Gu et al. |
| 2008/0094640 A1 | 4/2008 | Cordingley et al. |

FOREIGN PATENT DOCUMENTS

| | | |
|---|---|---|
| DE | 3042650 | 11/1980 |
| DE | 19608937 | 9/1996 |
| EP | 0098999 | 1/1984 |
| EP | 0317830 | 5/1989 |
| EP | 0368309 | 5/1990 |
| EP | 0902474 | 3/1999 |
| EP | 1145797 A2 | 10/2001 |
| EP | 1 260 838 B1 | 11/2002 |
| EP | 1 260838 | 11/2002 |
| JP | 60250211 | 12/1985 |
| JP | 1055327 | 3/1989 |
| JP | 4033784 | 2/1992 |
| JP | 5169286 | 7/1993 |
| JP | 05169286 A | 7/1993 |
| JP | H5-169286 | 7/1993 |
| JP | 2001-212685 | 8/2001 |
| WO | WO96/10833 | 4/1996 |
| WO | WO98/42050 | 9/1998 |
| WO | WO00/32349 | 6/2000 |
| WO | WO03/052890 | 6/2003 |
| WO | WO2004/016387 | 2/2004 |

OTHER PUBLICATIONS

Fauchet, P.M., et al., Surface Ripples on Silicon and Gallium Arsenide Under Picosecond Laser Illumination, Applied Physics Letter, vol. 40, No. 9, May 1, 1982, pp. 824-826.

Pedraza, A.J., et al., Silicon Microcolumn Arrays Grown by Nanosecond Pulsed-Excimer Laser Irradiation, Applied Physics Letter, vol. 74, No. 16, Apr. 19, 1999, pp. 2322-2324.

Lenzner, M., et al., Femtosecond Optical Breakdown in Dielectrics, Physical Review Letters, vol. 80, No. 18, May 4, 1998, pp. 4076-4079.

Rothenberg, Joshua E., et al., Laser Sputtering, Part II. The Mechanism of The Sputtering of $Al_2O_3$, Nuclear Instruments and Methods in Physics Research, B1, 1984, pp. 291-300.

Meunier, M., et al., Processing of Metals and Semiconductors by a Femtosecond Laser-Based Microfabrication System, Proceedings of the SPIE, vol. vol. 4978, 2003, pp. 169-179.

Singh, Amit P., et al., Effect of Polarization on the Surface Damage Morphology of GaAs Single Crystal During Irradiation With Picosecond Laser Pulses, Optics & Laser Technology 34, 2002, pp. 23-26.

Belforte, David A., Micromachining: The Growth Engine for Industrial Lasers, Optoelectronics World, Jun. 2001, p. 181.

Higgins, Jim, Excimer Lasers Machine in the UV, Optoelectronics World, Jun. 2001, pp. 183-186.

Kilgo, Marvin, Excimer Lasers Target Material Ablation, Optoelectronics World, Jun. 2001, pp. 191,193-194.

Keirstead, et al., UV Lasers Are Workhorses, Optoelectronics World, Jun. 2001, pp. 197-198, 200-201.

Bado, Philippe, Micromachine with Ultrafast Pulsing, Optoelectronics World, Jun. 2001, pp. 205-206.

Rossi, Brian, Fiber Lasers Target Manufacturing, Optoelectronics World, Jun. 2001, pp. 209-210.

Moser, David, Lasers Tool Up For Via Formation, Optoelectronics World, Jun. 2001, pp. 213-214.

Schaeffer, Ronald D., A Closer Look at Laser Ablation, Optoelectronics World, Jun. 2001, pp. 217-219.

Pasmanik, Guerman, Pico Versus Femto in Micromachining, Optoelectronics World, Jun. 2001, pp. 221-222 & 224.

Kauf, Michael, et al., Microvia Formation in PCBs, Optoelectronics World, Jun. 2001, pp. 227-228, 230-231.

Ameer-Beg, S., et al., Femtosecond Laser Microstructuring of Materials, Applied Surface Science, 127-129, 1998, pp. 875-880.

Korte, F., et al., Towards Nanostructuring With femtosecond Laser Pulses, Applied Physics A 77, 2003, pp. 229-235.

Deki, K., et al., Short Pulse Solid-State Raman Laser and its Application to Laser-Machining, pp. 1-3 & enlarged Figures 3 & 4.

Krüger, Jorg, et al., Femtosecond-Pulse Laser Processing of Metallic and Semiconducting Thin Films, SPIE vol. 2403, Feb. 8-10, 1995, San Jose, CA, pp. 436-447.

Simon, P., et al., Ablation of Submicron Structures on Metals and Semiconductors by Femtosecond UV-Laser Pulses, Applied Surface Science, 109/110, 1997, pp. 25-29.

Masur, Air, SiO, Mask Patterning, Optics and Photonics News, Feb. 2003, pp. 32-36.

Graydon, Oliver, Dyes Create Colorless Welds, Optics, Org., May 21, 2003.

Liu, Hsiao-Hua, et al. Effects of Wavelength and Doping Concentration on Silicon Damage Threshold, Semiconductor Devices, 1985, Chapter 2, pp. 1-2.

Notification Concerning Transmittal of Copy of International Preliminary Report on Patentability (Chapter 1 of The Patent Cooperation Treaty) Jan. 18, 2007.

Lia Handbook of Laser Materials Processing, Chapter 15, Marking, pp. 521-539, Chapter 18, Laser Marking/Branding, pp. 589-593, Chapter 19, Link Cutting/Making, pp. 595-615.

\* cited by examiner

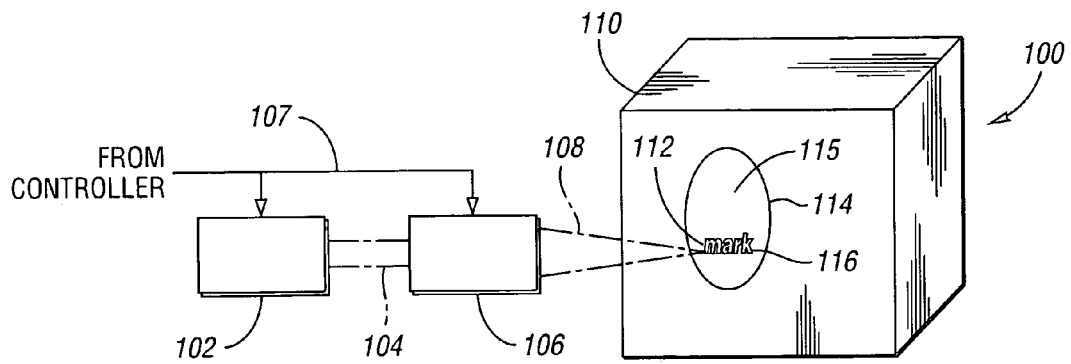
Fig. 1
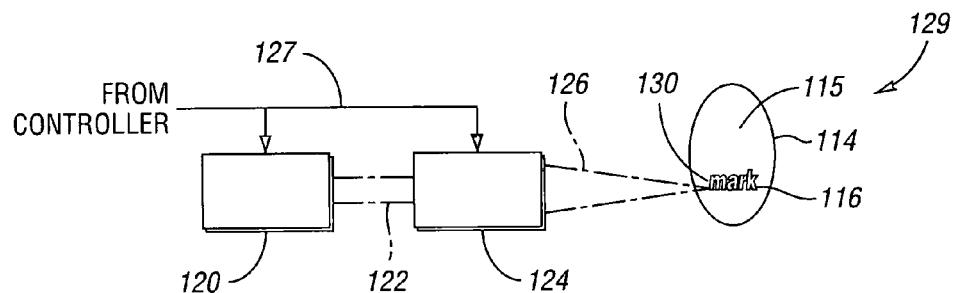
Fig. 2
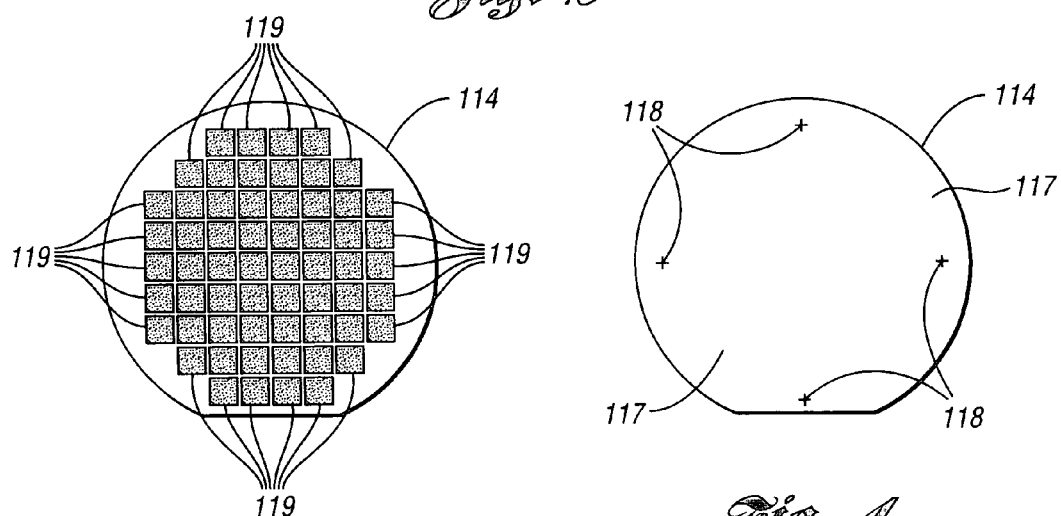
Fig. 3
Fig. 4

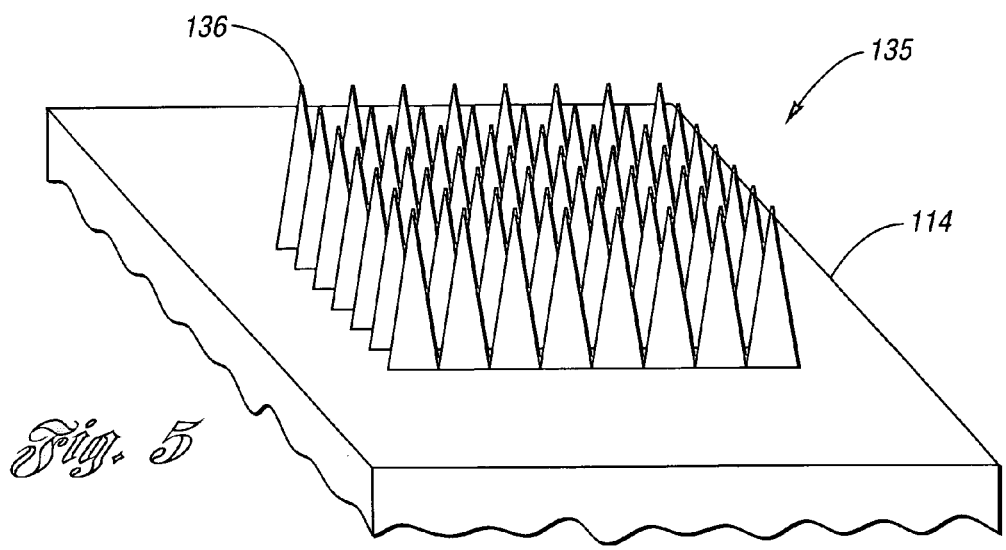
Fig. 5
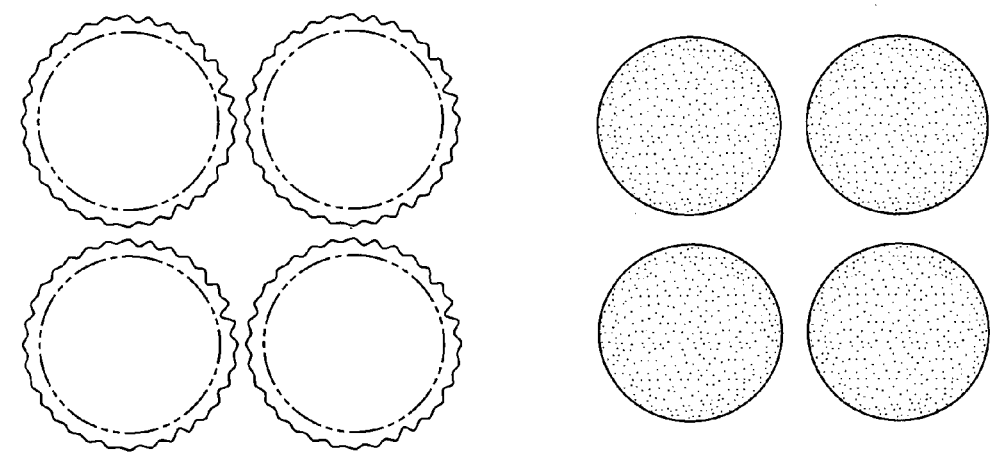
Fig. 6
(PRIOR ART)
Fig. 7
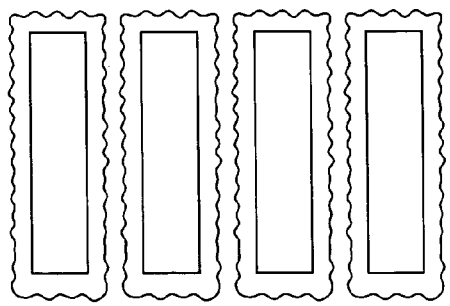
Fig. 8
(PRIOR ART)
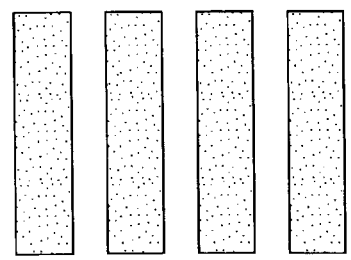
Fig. 9

MARK STARTS TO MELT 0.28mm

LASER-BASED METHOD AND SYSTEM FOR PROCESSING TARGETED SURFACE MATERIAL AND ARTICLE PRODUCED THEREBY

CROSS-REFERENCE TO RELATED APPLICATION

This is a divisional of application Ser. No. 11/152,509 filed on Jun. 14, 2005 which claims the benefit of U.S. Provisional application Ser. No. 60/584,268 filed Jun. 30, 2004.

BACKGROUND OF THE INVENTION

1. Field of the Invention

The present invention relates to laser marking and texturing, particularly forming at least semi-permanent or erasable indicia on one or more materials of a microelectronic device. The materials may include semiconductor substrates, thin films, metallization, and dielectric layers. One or more embodiments may also be applied for forming indicia on MEMs, optoelectronic devices, or biomedical microchips. Various embodiments are useable for various micromachining or microfabrication applications.

2. Background Art

Prior to 1999, Silicon wafer marking was used for identification at wafer level. Initially driven by the Known Good Die, and more recently by traceability and component identification, laser marking on the backside of the wafer at the die level has become the trend, and applied to various packaging technologies, including MCM, Flip Chip, DCA, and CSP. For the past years, research and development effort occurred to develop such a marking tool for production.

One of the emerging challenges for die marking is the recent introduction of very thin wafers. Previously, wafer thickness specifications of 300 to 700 microns ($\mu$m) were typical. Present requirements for smaller die, both in terms of area and thickness, are resulting in wafers as thin as 150 $\mu$m. Long-term projections are for wafer thickness to be reduced to a feasible limit.

Another challenge is the continuing shrinking of die sizes. For example, die used in DCA (Direct Chip Attach) applications are in the 3 mm to 8 mm dimension. However, products like the RFID tags can be as small as 0.3 mm yet require much of the same information that is included in large die marking. This trend creates the need for further development in die marking to shrink the actual alphanumeric character sizes.

Traditional wafer marking systems are not well suited to present and emerging requirements.

Valuable advancements have been demonstrated, for instance as disclosed in published US Patent Application Number 2003/0060910 entitled "High Speed, Laser-Based Marking Method And System For Producing Machine Readable Marks On Workpieces And Semiconductor Devices With Reduced Subsurface Damage Produced Thereby," assigned to the assignee of the present invention, published 1 Apr. 2004. However, there is a need to produce high contrast indicia while providing for decreased feature sizes—and to form indicia on microelectronic materials, known to have widely varying optical properties.

Desirable advancements for precision laser marking systems includes: increasing mark density (e.g., smaller effective dot size or line width), control over the marking depth, and improved mark repeatability with control of or substantial elimination of a heat affected zone. There is a need for improvement of readability (e.g., mark contrast with the background), preferably, angle independent contrast.

The ideal mark will be formed with little or no material removed, and will provide contrast that will survive through one or more subsequent fabrication steps. Further, shrinking sizes are expected to mandate increasing density requirements, for instance, font sizes less than 0.3 mm and decreased font spacing.

SUMMARY OF THE INVENTION

An object of at least one embodiment of the invention is to provide a method of forming indicia/texture on at least one material of a microelectronic article. The method includes the step of applying a pulsed laser output to a localized region of the material, the output having sufficient total fluence to initiate ablation within at least a portion of the region and a pulse width short enough such that the region and proximate material surrounding the region are substantially slag-free.

Another object of at least one embodiment of the invention is to provide an article of manufacture produced by the above method.

Yet another object of at least one embodiment of the invention is to provide a laser marking/texturing system for carrying out the above method.

In carrying out the above objects and other objects of the present invention, a method for processing targeted surface material within a region of a workpiece while avoiding undesirable changes to adjacent non-targeted material is provided. The method includes generating a pulsed laser output including at least one pulse having a wavelength and a pulse width. The method further includes irradiating the targeted surface material of the workpiece with the pulsed laser output including the at least one pulse to texture the targeted surface material. The pulsed laser output has sufficient total fluence to initiate ablation within at least a portion of the targeted surface material and the pulse width is short enough such that the region and non-targeted material surrounding the region are substantially free of slag.

The textured surface material may include indicia.

The indicia may be at least semi-permanent or erasable.

The workpiece may be a microelectronic device and the textured surface material may be a microelectronic material.

The targeted surface material may be at least one of a semiconductor substrate, a thin film, a metal layer and a dielectric layer.

The workpiece may be one of a MEMs device, an optoelectronic device and a biomedical chip.

The non-targeted surface material may include indicia.

The indicia may be machine-readable.

The indicia may have a font size less than 0.3 mm.

The textured surface material may include a microtextured pattern formed on the workpiece.

The workpiece may be a semiconductor wafer and wherein the microtextured pattern forms indicia on the wafer.

The method may further include generating a secondary laser output and irradiating the textured surface material with the secondary laser output to process the textured surface material.

The textured surface material may include indicia, and the indicia may be erased during the step of irradiating with the secondary laser output.

The textured surface material may be formed on at least one side of the workpiece.

The workpiece may be a semiconductor wafer.

The step of generating may be at least partially performed with a femtosecond or picosecond laser.

The pattern may be a bar pattern, an alphanumeric character string, or a logotype.

The pulse width of the at least one pulse may be below about 1 ns.

The pulse width may be about 100 ps or less, or may be less than about 10 ps.

The textured surface material may include microtextured surface material.

The microtextured surface material may include nanotextured surface material.

The total fluence may be measurable over a spatial dimension of a spot of the output.

The textured surface material may include indicia, and the step of irradiating may include the step of directing the laser output in response to at least one control signal that represents a first location of at least a part of the indicia to impinge the region at the first location.

The region may be within the spatial dimension of the spot.

The step of irradiating may substantially increase surface roughness of the targeted surface material within at least a portion of the region.

The non-targeted surface material surrounding the region may have a surface with a strong specular reflection component.

Diffuse reflectance of the indicia may be in a range of 0.5% to 5%.

The total fluence may exceed about 0.1 $J/cm^2$.

The wavelength may be less than an absorption edge of the targeted surface material.

The wavelength may be ultraviolet.

The pulse width of the at least one pulse may be in a range of about 15 fs to 500 ps.

The pulse width of the at least one pulse may be in a range of about 100 fs to 50 ps, or may be in a range of about 300 fs to 15 ps.

The targeted surface material may be silicon, or may be a metal or a dielectric.

The targeted surface material may be a portion of a dielectric passivation layer. The dielectric of the layer may be an inorganic, organic, or a low-k dielectric.

The targeted surface material may be part of a MEM device.

A portion of the indicia may have surface variations in a range of about 0.25 microns to about 1 micron.

A feature dimension of the indicia may be in a range of several microns to tens of microns, or may be a few wavelengths of the at least one pulse.

The step of irradiating may include the step of controlling polarization of the pulsed laser output to enhance or control a characterization of the textured surface material.

The pulsed laser output may include a focused laser processing beam, and the step of irradiating may include the step of relatively moving the workpiece and the focused laser processing beam.

The textured surface material may include a microtextured pattern, and the step of relatively moving may create the microtextured pattern on the workpiece.

The step of irradiating may include the step of shaping the spot to obtain a shaped spot.

The shaped spot may have a top-hat irradiance profile.

The shaped spot may have a depressed center with energy concentrated in a perimeter of the shaped spot.

The step of irradiating may include the step of controlling an aspect of the spot.

The wavelength may be below an absorption edge of a material of the workpiece.

The pulsed laser output may finely texture the targeted surface material and the secondary laser output may coarsely process the textured surface material.

The pulsed laser output may coarsely texture the targeted surface material and the secondary laser output may finely process the textured surface material.

The textured surface material may include indicia, and a negative window mark may be created during the step of irradiating with the secondary laser output.

The textured surface material may include a pattern, and the step of irradiating with the secondary laser output may micromachine the pattern.

The step of irradiating with the secondary laser output may trim an electrical or mechanical parameter of the textured surface material.

The secondary laser output may include at least one pulse having a wavelength which is absorbed into the textured surface material.

The wavelength of the at least one pulse of the secondary beam may or may not be absorbed into the non-targeted material surrounding the region.

Further in carrying out the above objects and other objects of the present invention, a system for processing targeted surface material within a region of a workpiece while avoiding undesirable changes to adjacent non-targeted material is provided. The system includes a primary laser subsystem which includes a primary laser source for generating a pulsed laser output including at least one pulse having a wavelength and a pulse width. The system further includes a delivery subsystem for irradiating the targeted surface material of the workpiece with the pulsed laser output including the at least one pulse to texture the targeted surface material. The pulsed laser output has sufficient total fluence to initiate ablation within at least a portion of the targeted surface material. The pulse width is short enough such that the region and the non-targeted material surrounding the material are substantially free of slag.

The primary laser source may include an ultrafast laser.

The ultrafast laser may be a picosecond laser, or may be a femtosecond laser.

The delivery subsystem may include a controller that accepts data that represents a location of the targeted surface material to be textured and produces at least one position control signal.

The delivery subsystem may include a positioning subsystem for directing the laser output to the location of the targeted surface material so as to texture the targeted surface material in response to the at least one position control signal.

The system may further include a secondary laser subsystem which includes a secondary laser source for generating a secondary laser output which irradiates the textured surface material.

The secondary laser output may at least erase, micromachine, weld or actuate the region of the textured surface material.

The secondary laser source may include one of a pulsed, modulated or CW source.

Irradiation with the secondary laser output may be below the fluence breakdown threshold of the targeted surface material to heat the region.

Irradiation with the secondary laser output may be above the fluence breakdown threshold of the targeted surface material to effect at least one property change of the targeted surface material.

The secondary laser output may include at least one pulse having a wavelength near or exceeding the absorption edge of the material of the workpiece.

The primary laser source may include the secondary laser source or may be separate from the secondary laser source.

The delivery subsystem may include a polarization controller for controlling polarization of the laser output.

The primary laser source may include a diode-pumped, solid-state UV laser, and the pulse width may be less than about 20 ns.

The pulse width may be less than 1 ns.

The positioning subsystem may include at least one translation stage to move the workpiece relative to the laser output.

The positioning subsystem may include fine and coarse positioners.

The positioning subsystem may include translation and rotation stages to move the workpiece relative to the laser output.

The positioning subsystem may include an optical scanner to move the laser output relative to the workpiece.

The positioning subsystem may include two or more stages and scanners to move the laser output relative to the workpiece.

The laser output may be a laser beam having a beam waist. The positioning subsystem may include at least one component for moving the beam waist relative to the workpiece.

The delivery subsystem may include a focusing subsystem.

The focusing subsystem may be a refractive optical subsystem.

The system may further include an inspection subsystem for inspecting the textured surface material.

The inspection subsystem may include a machine vision subsystem.

The primary laser source may include a mode-locked oscillator and a diode-pumped, solid-state laser amplifier.

The optical scanner may be a two-dimensional, galvanometer-based scanner.

The at least one position control signal may be produced during at least one step of manufacturing an article from the workpiece.

The primary laser subsystem may include a seed laser and a fiberoptic amplifier.

The primary laser subsystem may further include a frequency-doubled, diode-pumped, solid-state laser.

The primary laser subsystem may still further include a mode-locked oscillator, a diode-pumped, solid-state laser amplifier, and a wavelength shifter.

The primary laser subsystem may yet further include one of a frequency doubler, a frequency tripler and a frequency quadrupler.

The laser output may have a repetition rate greater than 10 KHz.

The laser output may have an average laser output power in the range of 0.01 W-2 W.

The textured surface material may include indicia. The system may further include a viewing subsystem for reading the indicia. The viewing subsystem may include an illuminator and an electronic imaging subsystem.

The illuminator may be one of a bright-field, a dark-field, and a combination of both bright- and dark-field.

Yet still further in carrying out the above objects and other objects of the present invention, an article of manufacture is provided. At least one surface material has discernible indicia formed thereon during at least one step of manufacturing the article. The indicia are formed by a method of selectively irradiating targeted surface material within a region of a workpiece with a pulsed laser output. The indicia are at least semi-permanent and useable during a subsequent step of manufacturing the article. The region and non-targeted material surrounding the region are substantially slag-free. Surface roughness is increased within at least a portion of the region during the at least one step of manufacturing, thereby reducing reflection of energy used for reading the indicia.

High reflectance contrast may be obtained between the region and a background of the region over a wide range of viewing angles.

A surface of the background of the region may have a strong specular reflection component.

Reflectance contrast between the discernible indicia and a background of the region may exceed 30:1 over an angular viewing range of at least 20 degrees.

The indicia may include an alphanumeric indicium having a font dimension 0.3 mm or finer.

The indicia may include a two-dimensional matrix code.

The indicia may be useable for one or more steps of manufacturing the article in addition to identification.

The indicia may be distinguishable from a background of the region with a roughness measurement obtained by at least one of SEM (scanning electron microscope) data, and AFM (atomic force microscope) data.

DIN 4768 roughness measurement standards may be utilized to compare roughness of a portion of the indicia with a background of the region.

The indicia may be distinguishable from a background of the region with a measurement of image contrast.

The indicia may be machine readable, and may appear as a sequence of non-overlapping dots that form a dot matrix code.

The indicia may be usable in at least one of traceability, component identification, and sorting.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

These and other features, aspects, and advantages of the invention will become better understood with regard to the following description, accompanying drawings and attachments where:

FIG. 1 is a schematic block diagram showing some elements of a laser processing system corresponding to one embodiment of the present invention wherein a microtextured pattern is formed on a workpiece, for instance, to form indicia on a portion of a semiconductor wafer;

FIG. 2 is a schematic block diagram showing some elements of a laser processing system corresponding to one embodiment of the present invention wherein a microtextured pattern, which may be formed with the system of FIG. 1a, is further processed with a secondary beam, for instance to erase a mark;

FIGS. 3 and 4 illustrate some details of first and second sides of semiconductor wafer, an example of a workpiece which may be processed with various embodiments of the present invention;

FIG. 5 is a schematic illustrating an exemplary microtextured region which may be formed with a femtosecond laser system;

FIGS. 6 and 7 are schematics comparing prior art marks with marks formed in accordance with the present invention, and illustrate improved density of a dot matrix pattern;

FIGS. 8 and 9 are schematics comparing prior art marks with marks formed in accordance with the present invention, and illustrate improved density of a bar pattern;

FIGS. 24-37*d* illustrate various examples and results wherein silicon wafers having ground, polished, smooth, or rough surfaces are marked in accordance with the present invention.

DETAILED DESCRIPTION OF THE PREFERRED EMBODIMENTS

Figure 10:
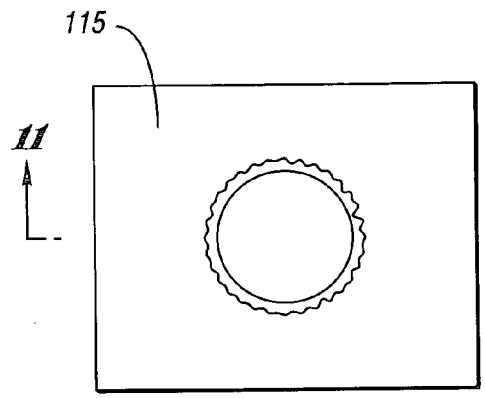
FIGS. 10 and 11 are schematics illustrating, by way of example, a prior art laser mark formed on a specular surface, for instance bare silicon, and a corresponding surface profile showing exemplary defects associated with a deep ("hard") mark—for instance slag and melted zones, debris, and microcracking.

For the purpose of the following description of various embodiments of the invention, the following non-limiting guidelines are used:

"Ultrafast laser" or "ultrashort laser" generally refers to a pulsed laser providing one or more pulses, each pulse having a duration below 1 ns, for instance 100 ps or less, or typically less than 10 ps;

"Microtexture" generally refers to micron sized surface variations, but may also include surface variations of a finer scale, for instance 0.5 microns or 0.1 microns; and "Nanotexture" generally refers to surface variations below one micron in size.

Overview

New laser marking technology has been developed to overcome limitations of present laser marking systems. Permanent and high contrast shallow marks (less than 1 micron) on the backside of wafers are achieved with little or no material removed by using this new laser technology. Viewing of these marks is strongly independent of the viewing angle, a significant advancement. The so-called micro marking technology allows the mark font size to be much less than 0.3 mm.

As will become apparent in sections that follow, various embodiments may be also applied to mark erasing, microjoining, laser welding, and microactuation.

At least one embodiment of the invention may be applied to micro machining of fine, laser-marked patterns.

One or more embodiments of the invention may be applicable to laser micro assembly techniques for silicon articles including laser welding and laser actuation of micro device members.

Laser Marking/Texturing Method

One aspect of the invention features a method of marking a material of a microelectronic device with a pulsed laser output to form high-density, discernible indicia on the material. The method includes: generating a pulsed laser output having at least one pulse with a pulse duration less than about 1 ns and having total fluence sufficient to initiate ablation of a portion of the material, the fluence being measurable over a spatial spot dimension of the output. The method further includes directing the laser output in response to at least one control signal that defines a first location of at least a portion of indicia to be formed on the material, to impinge a localized region of the material at the first location, the localized region being within the spatial spot dimension. The laser output initiates ablation of at least a portion of the material and substantially increases surface roughness within at least the portion of the region. The region and background material that proximately surrounds the region are both substantially slag-free.

A background surface may have a strong specular reflection component.

The diffuse reflectance of the indicia may be in a range of 0.5% to 5%.

The total fluence may exceed about 0.1 J/cm$^2$.

The laser output may have a wavelength less than an absorption edge of the material.

The laser wavelength may be ultraviolet.

The pulse duration may be in the range of about 15 fs to 500 ps.

The pulse duration may be in the range of about 100 fs to 50 ps.

The pulse duration may be in the range of about 300 fs to 15 ps.

The material may be silicon.

The material may be a metal or dielectric.

The material may be a portion of a dielectric passivation layer, and the dielectric may be inorganic, organic, or a Low-k dielectric.

The material may be part of a MEM device.

A portion of the indicia may have surface height variations in the range of about 0.25 microns to about 1 micron.

A feature dimension of the indicia may be in the range of several microns to tens of microns.

A feature dimension of the indicia may be a few optical wavelengths.

Laser Marking/Texturing System Another aspect of the invention features a laser marking system. The marking system includes: means for generating a pulsed laser output having at least one pulse with a pulse duration less than about 1 ns and having total fluence over a spatial region of the output sufficient to initiate ablation of a portion of a material to be marked; a controller that accepts data that define indicia to be formed on a material of a microelectronic article and produces at least one position control signal to direct a laser output to mark the material and thereby form the indicia; and means for directing the laser output to a surface location of the material to be marked so as to form discernible, high contrast, high-density indicia on the material surface.

The means for directing may include an optical scanner.

The means for directing may include a positioning subsystem for positioning the material relative to the laser beam in three dimensions.

The positioning subsystem may have three or more degrees of freedom.

The optical scanner may be a two-dimensional, galvanometer-based scanner.

The means for directing may include an X-Y stage and a beam deflector coupled to the controller.

The position control signal may be produced during at least one step of manufacturing the article.

The means for generating may includes a seed laser and a fiber optic amplifier.

The means for generating may include a frequency doubled, diode-pumped, solid-state laser.

The means for generating may include a mode-locked oscillator, a diode-pumped, solid-state laser amplifier, and a wavelength shifter.

The means for generating may include a frequency doubler, frequency tripler or frequency quadrupler.

The laser output may have a repetition rate greater than 10 KHz.

The average laser output power may be in the range of 0.01W-2W.

The system may further include a viewing system for reading the indicia, including an illuminator and an electronic imaging system.

The illuminator may be bright-field.

The illuminator may be dark-field.

The illuminator may be a combination of bright and dark field.

Article of Manufacture

One aspect of the invention features an electronic article. The article includes at least one material having discernible indicia formed on the material during at least one step of manufacturing the article. The indicia are formed by a method of selectively irradiating at least one localized material region with a pulsed laser output. The indicia are at least semi-permanent and useable during a subsequent step of manufacturing the article. A marked region and background material that proximately surrounds the region are both substantially slag-free. The surface roughness is increased within at least a portion of the material region, and thereby reduces reflection of energy used for reading the indicia.

Preferably, the method of selectively irradiating at least one localized material region with a pulsed laser output is the above section entitled "Laser Marking/Texturing Method."

High reflectance contrast may be obtained between the region and the background over a wide range of viewing angles.

A background surface may have a strong specular reflection component.

Reflectance contrast between the discernible indicia and the background may exceed 30:1 over an angular viewing range of at least 20 degrees.

The indicia may include an alphanumeric indicium having font dimension 0.3 mm or finer.

The indicia may include a two-dimensional matrix code.

The indicia may be useable for one or more manufacturing steps in addition to identification.

The indicia may be distinguished from the background with a roughness measurement obtained by at least one of SEM (scanning electron microscope) data, and AFM (atomic force microscope) data.

DIN 4768 roughness measurement standards may be utilized to compare the roughness of a portion of the indicia with the background.

The indicia may be distinguished from the background with a measurement of image contrast.

The indicia may be machine readable.

The indicia may appear as a sequence of non-overlapping dots that form a dot matrix code.

The indicia may be used in at least one of traceability, component identification, and sorting.

Laser Processing

Embodiments of the present invention may be used to form indicia on ground, polished, or smooth material surfaces, based on specific application requirements. A surface may be coated. By way of example, the surface may be either side of a semiconductor wafer, or another material used in a step of fabricating a microelectronic device.

With reference to FIG. 1, an ultrafast laser source 102 of a laser processing system, generally indicated at 100, generates a laser output 104 which includes one or more pulses. The laser output 104 propagates through delivery optics 106 that focus the output and deliver the beam into a process chamber 110, the chamber 110 being used if the laser processing is to be carried out in a gaseous environment. The process chamber 110 may contain a gaseous processing environment at a pressure, partial vacuum, or temperature as is known in the field of laser material interaction to produce microtextured silicon. For processing in ambient, atmospheric conditions the chamber is not required. The focused beam 108 produces a working spot 112 that is incident on the target material, which may be a portion of a silicon semiconductor wafer 114, and produces marked material 116 (not to scale).

With reference to FIGS. 3 and 4, the wafer 114 may have a bare (unpatterned) backside 117, which may be coated, polished, or rough. Fiducials 118 are used for alignment. The topside shown in FIG. 3 may have a large number of die 119 and corresponding dense circuit patterns.

An optional secondary laser processing system may be used for further processing. With reference to FIG. 2, to erase, micromachine, weld, or actuate the region of the mark, a second laser source 120 generates a secondary beam 122. High absorption within the marked region can support such further processing. For example, the actuation may occur as a result of differential thermal expansion of the material and background subsequent to heating the material with the secondary processing beam. The beam 122 propagates through secondary delivery optics 124 that focus the beam. The secondary laser source 120 may be a pulsed, modulated, or CW source, depending on the application. The focused beam 126 produces a secondary working spot 130 that is incident on the wafer 114 and irradiates the marked material 116. The irradiation may be below the ablation threshold of the marked material to heat the region for actuation or above the threshold to effect material property changes.

In various embodiments, the two laser systems 100, 129 having beam paths 104, 122 may be included in separate systems, or the optical systems may be combined by various well-known methods into a single laser system. There may be two optical axes, one for each beam path, or the beam paths may be combined for a coaxial beam path. A single laser head may produce the beams of the laser sources 102 and 120, or there may be two laser sources. By way of example, it is preferred that the secondary laser 120 has a wavelength near or exceeding the absorption edge of silicon. The choice of integrating into a single system may be based on specific design considerations, for example, workpiece dimensions, laser wavelengths and power, optical design considerations, component costs, available factory floor space, X-Y positioning requirements, etc.

The delivery systems 106 and 124, corresponding to the texturing system 100 and the secondary processing system 129, respectively, will often include some elements operated under computer control, as indicated by lines 107 and 127, respectively. For example, focusing, spot size adjustment, polarization control, and energy control functions may be controlled. Suitable combinations of electro-optic devices, modulators, and opto-mechanical devices for positioning may be utilized. For instance, either delivery system 106 or 124 may include a polarization controller to enhance or control a mark characteristic.

The ultrafast laser 102 may produce one or more femtosecond pulses. However, picosecond lasers may provide many of the benefits of femtosecond lasers but at reduced cost and complexity. Controlled laser-material interaction at the ultrafast scale can be used to control the contrast of the marks over a wide range to meet specific application requirements. Of further significance is the reduction or elimination of debris, slag, cracking, and other undesirable effects generally associated with traditional marking lasers.

Discrete areas of laser-patterned, microtextured material may be used to create high contrast marking on silicon, especially silicon wafers, and on other materials such as titanium or steel. By way of example, FIG. 5 illustrates an exemplary "spiky" textured region 135 with the surface height 136 illustrated by a typical spike. Such nearly periodic and sharp variation in roughness may be produced with femtosecond laser pulses. The spikes may have a height ranging from a fraction of one micron to tens of microns. The surface profile may be strongly dependent on laser parameters including pulse duration (i.e., width), peak energy, spot diameter, and spot irradiance profile. Researchers have postulated that such spike formation involves both laser ablation and laser-induced chemical etching.

Figure 11:
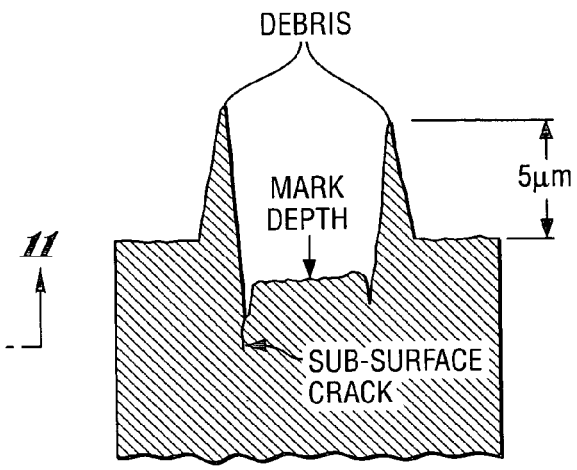
Figure 12:
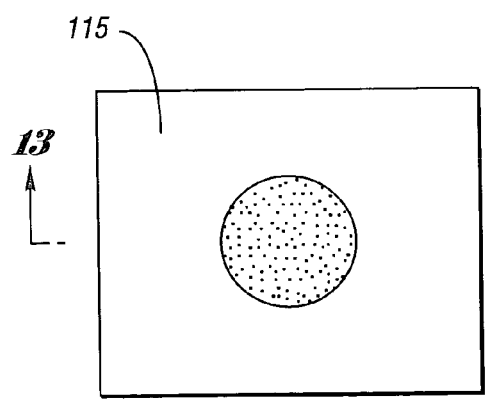
FIGS. 12 and 13 are schematics illustrating, by way of example, a mark formed on the specular surface of FIG. 10 using a system of the present invention and an exemplary profile for comparison with FIGS. 10 and 11.
Figure 13:
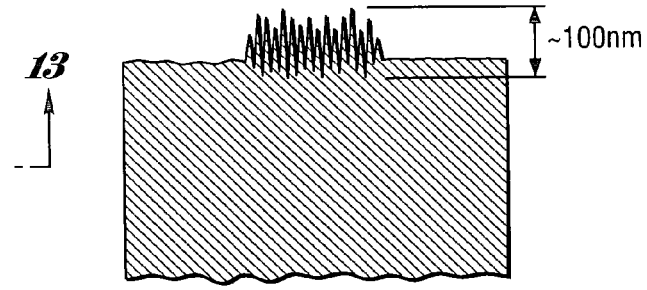

Embodiments of the present invention can be used to create microtextured regions having lower amplitude (e.g., sub-micron) surface height variations than exemplified in the above paragraph, but with sufficient variations to create high contrast, slag-free marks. Further, enhanced contrast and absence of debris provides for improved mark density when compared to traditional marking approaches. FIGS. 10 and 11 are schematics illustrating, by way of example, a prior art laser mark formed on a specular surface, for instance bare silicon, and a corresponding surface profile showing debris and cracking associated with a deep, "hard" mark. FIGS. 12 and 13 are schematics illustrating, by way of example, a mark formed on the specular surface of FIG. 10 using a system of the present invention. The pulsed laser may be a picosecond laser producing a pulsed output with total energy density (in one or more pulses) sufficient to initiate ablation within a portion of a spot area on the substrate surface. The surface height variations may be tens to hundreds of nanometers, the marked region generally showing significant roughness and eliminating at least strong reflection components.

FIGS. 6 and 7 are schematics comparing prior art marks with marks formed in accordance with the present invention, respectively, and illustrate improved density of a dot matrix pattern. FIGS. 8 and 9 are schematics comparing prior art marks with marks formed in accordance with the present invention, respectively, and illustrate improved density of a bar pattern.

Figure 21:
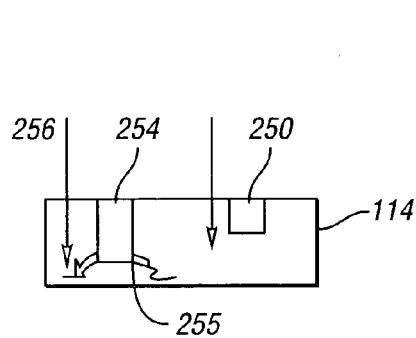
FIGS. 21 and 22 illustrate the structure of various laser marks produced with conventional and more recent laser marking systems for further comparison with a marks formed in accordance with the present invention.
Figure 22:
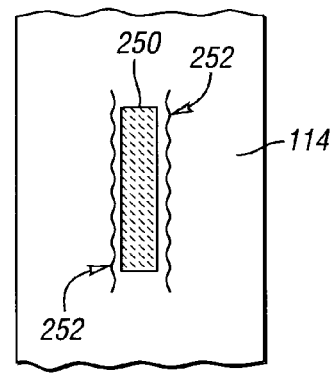

FIGS. 21 and 22 illustrate the structure of various laser marks produced with traditional and more recent laser marking systems for further comparison with a marked substrate produced in accordance with the present invention. FIGS. 21 and 22, respectively, are side and top schematic views of a mark 250 formed by the assignee of the present invention using a NdYVO4 laser with a pulse width of about 15 ns at 532 nm. The laser system produced shallow marks having a depth of about 1.5-4 microns without substrate cracking. FIG. 22 is a top view of a mark 250 illustrating the presence of ejected material 252 adjacent to the mark 250. This recent example corresponds to results disclosed in published US Patent Application Number 2004/0060910 entitled "High Speed, Laser-based Marking Method and System for Producing Machine Readable Marks on Workpieces and Semiconductor Devices with Reduced Subsurface Damage Produced Thereby," assigned to the assignee of the present invention, and published 1 Apr, 2004. FIG. 21 is a side schematic view of a relatively deep traditional "hard" mark 254, about 10 microns in depth, wherein cracking of silicon is observed with relatively deep, laser penetration 256.

In certain applications it may also be of interest to remove or erase a previously-formed, laser mark. The formation of highly-absorbing, microtextured regions provides for such capability because the region may be controllably modified using the secondary laser system configured with appropriate laser parameters.

With bright field visible at near infrared illumination, these textured (marked) areas formed in accordance with the present invention provide high contrast relative to the reflective wafer background surface 115. For instance, the wafer surface 115 may be smooth relative to a visible wavelength, thereby resulting in a strong specular reflection component with negligible diffuse reflection. A textured region may appear opaque, and will preferably have diffuse reflectance corresponding to the darkest shades of "grey scale charts" used for calibrating imaging systems.

Figure 14:
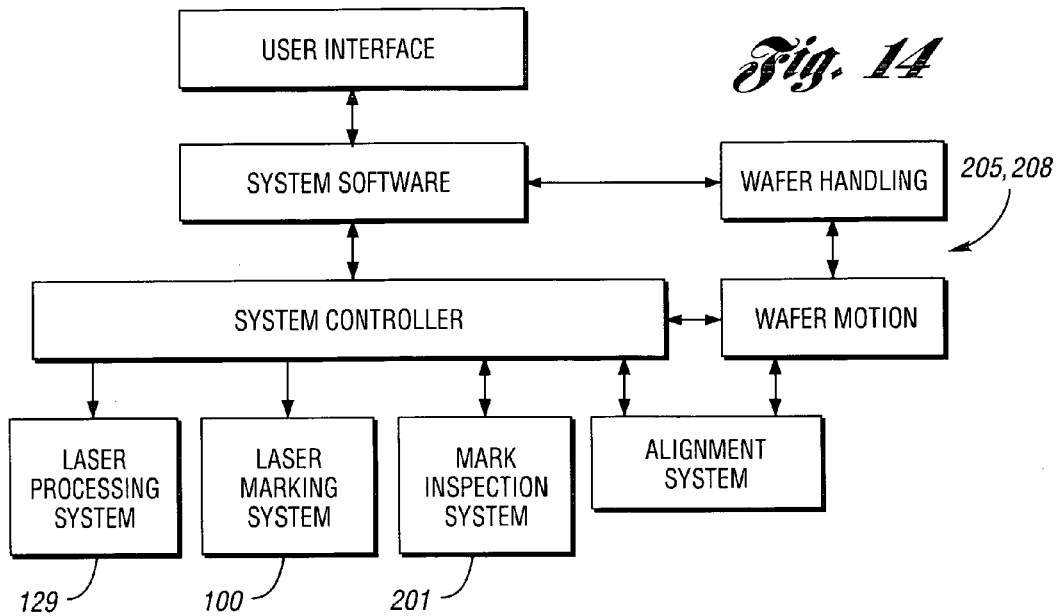
FIGS. 14 and 15 are schematic block diagrams showing some elements of a semiconductor wafer processing system.

By way of example, the diffuse reflectance may be in a range of about 0.5% to 5%, corresponding to about 6 shades of grey. The contrast provides detection for improved-detection, machine-readable marks such as alphanumeric strings, bar codes, matrix codes, etc. Such indicia may be viewed with a mark inspection system 201, which may be one component of a complete laser processing system as shown in FIG. 14 which, by way of example, includes both the marking laser system 100, and-the secondary laser processing system 129 of FIGS. 1 and 2, respectively. The system 129 may be used to erase a mark. Alternatively, a system may include only laser marking and an optional mark inspection system 201 without secondary processing. With an ultrafast (or ultra-violet) source, shallow marks with highly controllable depths are possible that would be advantageous for marking or coding very thin wafers, for instance, with mark dimensions substantially finer than present commercially available systems.

A following section entitled "Marking Examples" and referenced drawing figures show exemplary results using picosecond lasers to produce laser marks on silicon substrates having rough, ground, or smooth surfaces. The readability of the marks is improved over conventional laser marks. The marks appear substantially opaque and the contrast with the background remains high as a function of illumination and viewing angles, for instance, as the relative angle between an illumination source and receiver is varied over 30 degrees. This invariance increase the reliability of machine vision algorithms.

Laser Marking Systems

Various embodiments of the invention provide for high contrast marks on wafers and marks on other microelectronic articles or devices made from silicon. Further application is expected to MEMS and MOEMS devices and for providing marks or other patterns on materials such as Ti and steel.

The marking may be used primarily for identification, or it may be used to change the material's optical properties at discrete sites for functional or subsequent process reasons.

Figure 15:
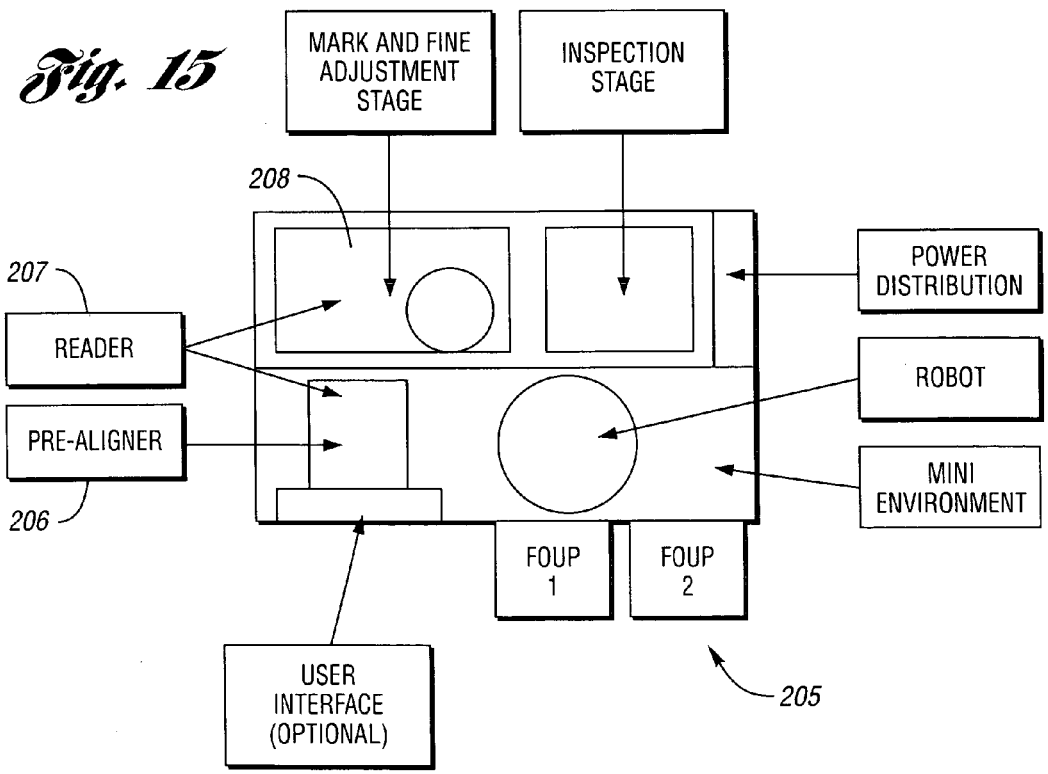

In a complete marking system, wafers to be processed are removed from a wafer carrier by a robotic wafer handling system 205, as illustrated schematically in FIGS. 14 and 15. Orientation of the wafer is determined by optical alignment, including operation of a pre-aligner 206 and any other required steps, for instance identifying the wafer type with a reader 207.

Figure 16:
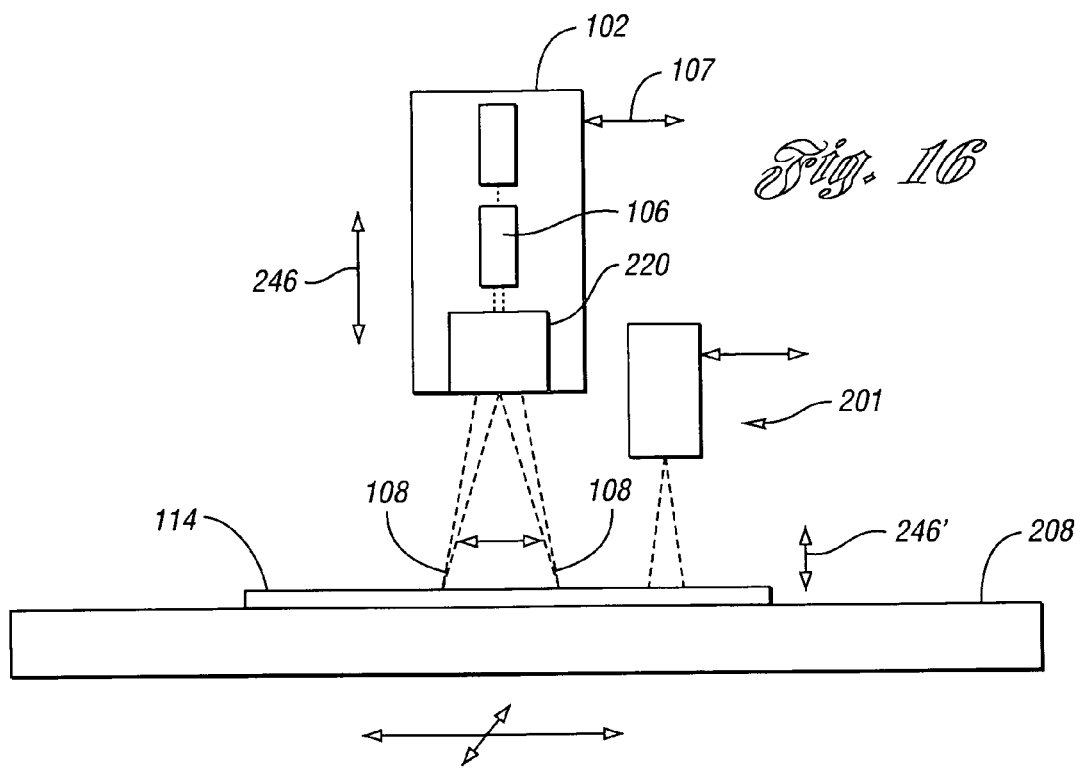
FIGS. 16 and 17 illustrate subsystems of a semiconductor wafer processing system corresponding to FIGS. 14 and 15 in further detail.

The laser 102 generates a processing beam. With reference to FIG. 16, the beam positioning system 106 delivers and focuses the ultrafast processing beam onto a workpiece, which may be a silicon substrate. Interaction of the focused processing beam with the material of the workpiece in an atmosphere or ambient environment creates microtexture on the surface of the workpiece.

Laser pulses 104 (i.e., FIG. 1) generated by the ultra-short pulse laser 102 propagate along the optical path 104, and are deflected or otherwise positioned with a beam positioner 220 (FIG. 16). The beam positioning will typically be carried out using two galvanometer scan mirrors which generally provide for deflection over a wide angle with a scan lens used to focus the output onto the wafer 114 which is typically mounted on an X-Y stage 208. Each laser pulse (or pulse sequence) forms a microtextured spot of material on the wafer 114. The positioning of the beam is determined by a controller so that a sequence of laser pulses forms characters or other indicia on the wafer 114. When the mark is complete, the wafer 114 is removed from the processing area and reloaded into its wafer carrier. Alternatively, a secondary processing step may occur with the system 129 before the wafer 114 is transferred.

Relative controlled movement of the workpiece and the focused processing beam selectively creates microtexture that forms discernible patterns on the workpiece.

Various spot-shaping and aligning methods such as shaping by dithering taught by Fillion in U.S. Pat. Nos. 6,341,029 and 6,496,292, and aspect and orientation modification taught by Ehrmann in U.S. Pat. No. 6,639,177 and others can be applied to laser microtexturing. For example, top-hat irradiance profile spots can provide indicia with more uniform microtexturing and reduced melting at the ablation threshold transition zone. With a top hat profile, the area of the spot at or above the ablation threshold can be increased without an increase in the pulse energy, thereby efficient microtexturing is achieved. It may be desirable to use a spot with a depressed center and energy concentrated in the perimeter to further limit melting and increase sharpness of the microtexture substrate transition at the kerf edge.

Round spots provide consistent exposure for line elements in any orientation. However, square and rectangular spots can further increase efficiency and uniformity by delivering a uniform dose across an aligned kerf width and to larger areas requiring filling. Control of the aspect of a spot can be used to precisely control the irradiance and spot overlap. For example, maximum pulse energy may be selected and spot length along a trajectory may be expanded or contracted to modify the shape of the area exposed at or above the ablation threshold. The spot may be expanded to expose a larger area at or above the ablation threshold without increasing the kerf width or can allow the kerf width to be reduced without increasing irradiance. The spot may be expanded to allow expose of at least a portion of the spot to an increased number of laser pulses. Conversely, compression of the spot along the kerf may be used to increase the exposure to or above the ablation threshold without decreasing the kerf width or can allow the kerf width to be increased without decreasing irradiance. Compression of the spot may also be used to allow exposure of at least a portion of the spot to a decreased number of pulses.

The laser may be an ultrafast laser. Generally, the laser parameters will depend of the linewidth to be marked, the material optical properties, and numerous system considerations and features (e.g., overall optical efficiency of the laser processing system). The ultrafast laser may have a wavelength below the absorption edge of the substrate, for example 532 nm for silicon processing. The average power, which relates to the required threshold fluence and repetition rate may be in the approximate range of 0.01W-2W for marking silicon wafers using various embodiments of the present invention. The pulse width (duration) may be less than 1 ns. Preferably, the laser pulse width will be in the range of about 100 fs to about 50 ps, and most preferably in the range of about 300 fs to 10 ps.

Certain embodiments may use a diode-pumped, solid-state UV laser with a pulse width less than about 20 ns, and preferably less than 1 ns. Formation of the desired microtexture may utilize gas-assist or a gaseous environment in the chamber 110, as shown in FIG. 1, for best results with UV processing.

FIGS. 16-19 show additional details of an exemplary laser processing system which may be used for laser marking of substrates, for instance marking of silicon wafers (front and/or backside). A positioning subsystem may include one or more translation stages 208 for moving the workpiece relative to the processing beam 108 along at least two axes. Numerous combinations of relative substrate and beam positioning devices are known to those skilled in the art of laser material processing, for instance, semiconductor processing, stereolithography, semiconductor laser repair, laser drilling, or semiconductor wafer trimming.

The features of FIGS. 7 and 9 (dots and bars, respectively) are typically tens of microns in commercially available marking systems. A laser marking system of the present invention may be used to produce significantly smaller feature sizes, for instance 5-10 micron dots. The features in FIGS. 7 and 9 may be characterized by a minimum resolvable distance between features of the pattern. The minimum resolvable distance may be on the order of a wavelength of the pulsed laser output, for instance 0.25 microns.

By way of example, it may be desirable to form indicia on a portion of a MEM, in a restricted area. By controlling the fraction of the energy above threshold in a merely diffraction-limited spot, sub-micron features may be formed, for instance 0.25 micron features, or 0.5-2 micron features if margin is to be provided. As such, the positioning system may include fine and coarse positioners to match or exceed the pattern resolution and provide for ultra-fine patterning. The fine stage may have a travel range on the order of millimeters positioning accuracy substantially finer than 1 micron, for instance 0.05 microns. The system may also include other auxiliary fine positioners, for instance precision, small-angle, beam deflectors (e.g., an acousto-optic deflector), together with closed loop control. Such positioning systems may be used in embodiments of the present invention for laser marking, patterning, joining, or other applications.

Figure 17:
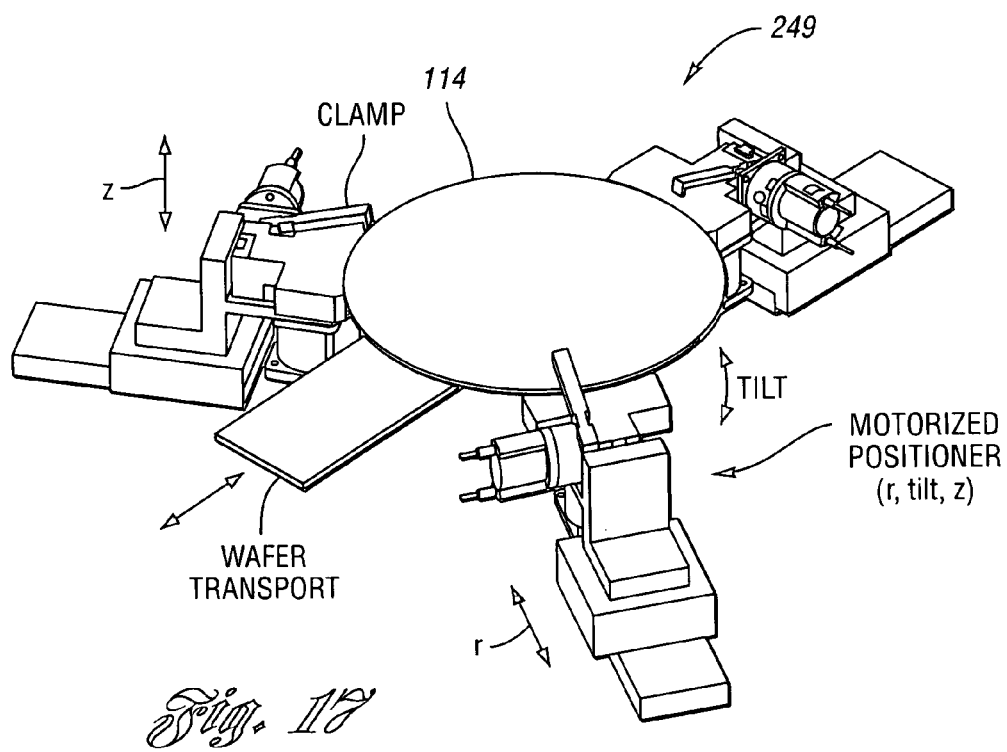

With reference to FIG. 17, embodiments of the invention for practicing laser marking and other applications with laser systems 100,129 may include irradiating first and second sides of the workpiece. By way of example, wafer chuck 249 may be mounted to an X-Y stage in a configuration suitable for laser systems 100,129 to irradiate opposite sides of the workpiece surface. The wafer chuck 249 may include a Z-axis translator and capability for tilting the workpiece (rotation about the x-y axes). Such precision translation and rotation stages have been applied in lithography, laser trimming, and similar applications.

With reference to FIGS. 16, 18, 19 and 20, either or both beam positioning systems 220, 220' may include a two-axis, galvanometer-based, beam scanner 240,242 to move the beam relative to the workpiece. Either beam positioning system 220, 220' may include a combination of two or more stages and scanners to move the processing beam relative to the workpiece in at least two axes. Further, components to position the beam waist relative to the workpiece through movement 246 of one or more optical elements within the secondary laser system may be included. Similarly, components may be included to move the beam waist relative to the workpiece in at least 3 axes using various combinations of movement 246 of optical system components with z-axis translation 246' using, for example, a motorized wafer chuck assembly.

Figure 18:
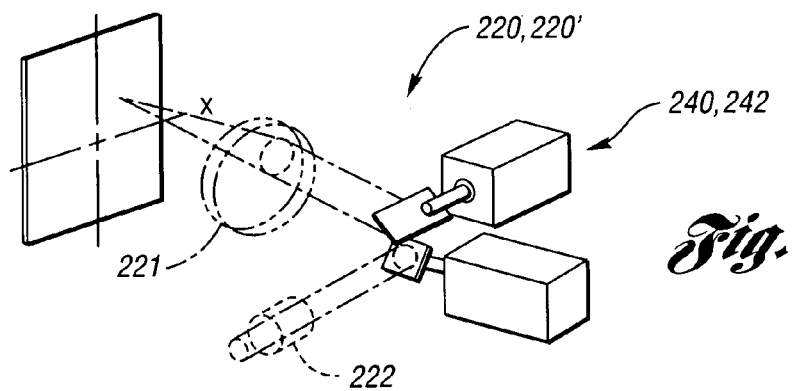
FIGS. 18 and 19 show some components of an exemplary laser beam positioning system which may be included in FIG. 1 or FIG. 2 for practicing various embodiments of the present invention.
Figure 19:
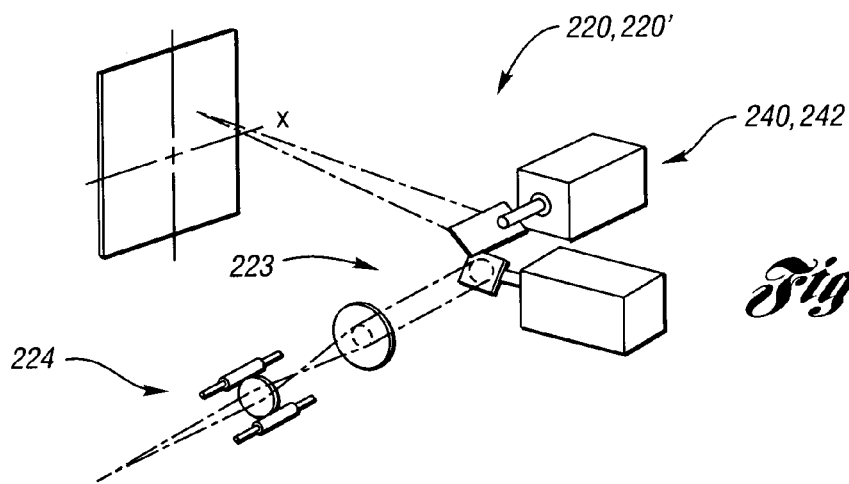

Precision galvanometric scanning heads 240,242 are available from GSI Lumonics Corporation (assignee of the present invention), Cambridge Technologies and Scan Labs LTD. Exemplary options for an associated optical system are illustrated in FIGS. 18 and 19 include: (1) a telecentric lens or f-theta corrected lens 221 with programmable spot size adjustment 222; and (2) a widefield post-objective system 223 and motorized dynamic focus adjustment 224 (not shown in FIG. 16).

The focusing subsystem 106 in the ultrafast system is illustrated as a refractive optical system. In embodiments where a femtosecond laser system produces a laser output, an all reflective system may provide for improved performance as a result of dispersion compensation. For example, an ultrashort pulse may have a wavelength spread of about 8 nm or more about the central wavelength. Femtooptics, Inc. is a supplier of femtosecond optical components.

Extremely high absorption microtextures may be produced in a non-ambient atmosphere, with processing carried out in a processing chamber. The processing atmosphere may containing gases or may be a vacuum to assist the formation of microstructures. However, it is preferred that microstructures are formed in a open atmosphere of gases, and it is most preferred that the workpiece is placed in ambient air.

The microtexture created reduces reflected energy off the surface of the workpiece. Generally, the microtexture created is spike or cone-like structures, on the order of or smaller than the wavelength of light, the surface profiles of which are illustrated in FIG. 5 as an exemplary regular arrangement and FIGS. 12 and 13 as a microtextured region with reduced height variation (peak amplitude) and regularity. Very highly absorbing structures have been made in process chambers. However, moderately absorbing structures (e.g., FIGS. 12 and 13) are considered for various embodiments of the present invention, thereby reducing the system requirements needed to create the microtextured regions.

In application to marking, the patterns formed may be alpha-numeric characters. The patterns formed may be logo-types. The patterns formed may be machine-readable. The patterns may be also be human-readable. A font size of finer than 0.3 mm is achievable using one or more embodiments of the present invention.

The system may include an integral mark inspection system 201 (i.e., FIG. 14) to identify the patterns, or the inspection may be included in a separate system or station of a manufacturing process. Commercially available machine vision technology, for instance pattern recognition systems supplied by Cognex, Inc. may be used for mark identification. When compared with conventional wafer marking technologies, laser-based microtexturing has produced high contrast marks, relatively insensitive to illumination conditions, including camera angle and lighting angle over a wide range. Similarly, for certain applications, if the marks result in imagery that is at least weakly dependent upon illumination or viewing angles, the inspection vision system 201 may be implemented (or replaced) with an optional "though the lens" vision system configuration integrated within a galvanometer system, for instance designs corresponding to FIGS. 18 and 19.

The substrate material may be a metal, a silicon wafer (bare or with various coatings). Other exemplary materials include inorganic or organic dielectrics (including low-k materials, metallization, refractory metals, and plastics).

The material to be marked may be part of a multimaterial device, which may include a layer of silicon dioxide on silicon, for instance. The material may be an inorganic or organic dielectric, for instance a passivation layer. The marked areas may be permanent, semi-permanent, or erasable so as to be utilized in the process of making the multimaterial device, for instance, to control or select various fabrication steps. Exemplary devices include a multimaterial semiconductor memory, damascene structure, processors, peripheral chips, etc., RFID tags, MCMs, and the like.

In one arrangement, allowing for efficient integration into existing systems supplied to the semiconductor industry, an ultra-short pulse laser source is to be included within a commercially soft-mark type of wafer marking system such as the GSI Lumonics WaferMark SigmaClean. Details regarding various laser system alternatives are included in a later section. The soft marks normally created in the wafer marking system are replaced with shallow, low-reflectance, angle-insensitive marks. Integration of the ultra-short pulse laser source requires mechanical and optical changes to couple the laser energy into an optical path of the machine, propagate the beam along the optical path and focus the beam onto the substrate. The integration may be carried out by design practices well-known to those skilled in the art of designing laser beam processing systems.

Material Removal/Erasing a Mark

A highly absorbing marked area may be irradiated for subsequent processing according to various methods of this invention. The secondary irradiation may use lasers that are more weakly absorbed in the substrate, for instance lasers that operate near or beyond the absorption edge of silicon. Various studies have shown increased absorptance within the microtextured regions both in the visible and the NIR. Near and beyond the absorption edge of silicon, high power processing lasers can be used with minimal damage to the normally transmitting substrate. The first ultrafast step may produce fine patterning that is processed with a coarse secondary beam, and conversely, the first step may produce a coarse mark that is finely patterned with the secondary step. The absorbing material may be ablated in a micromachining step with controlled depth.

Figure 23:
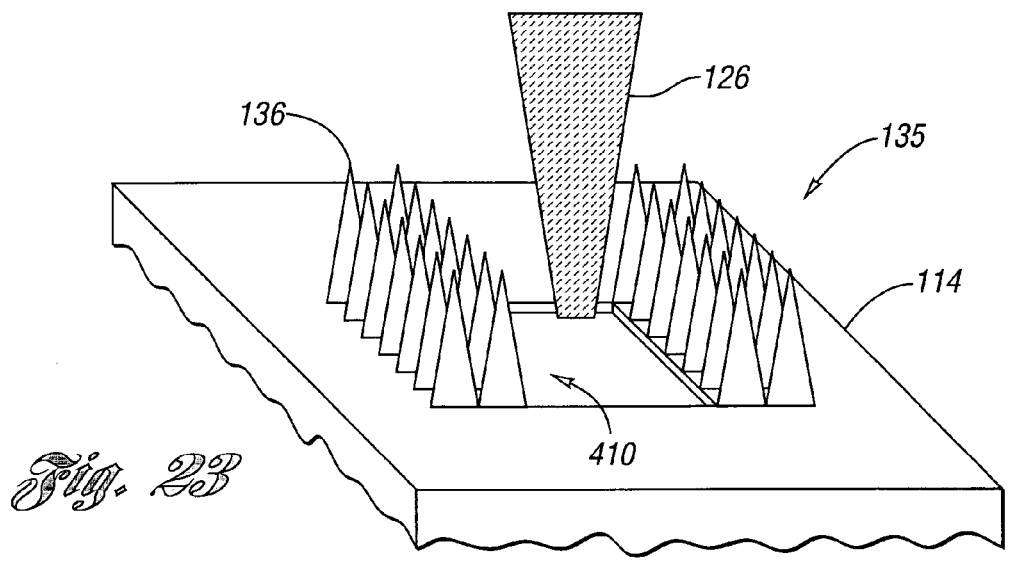
FIG. 23 illustrates removing material, for instance, erasing a mark using a secondary processing beam corresponding, for example, to FIG. 2.

With reference to FIG. 23, this ablation may be for the purpose of removing or erasing 410 the mark, creating a negative "window" mark on an absorbing field, or it may be to micromachine a fine pattern, or trim an electrical or mechanical parameter.

Figure 24:
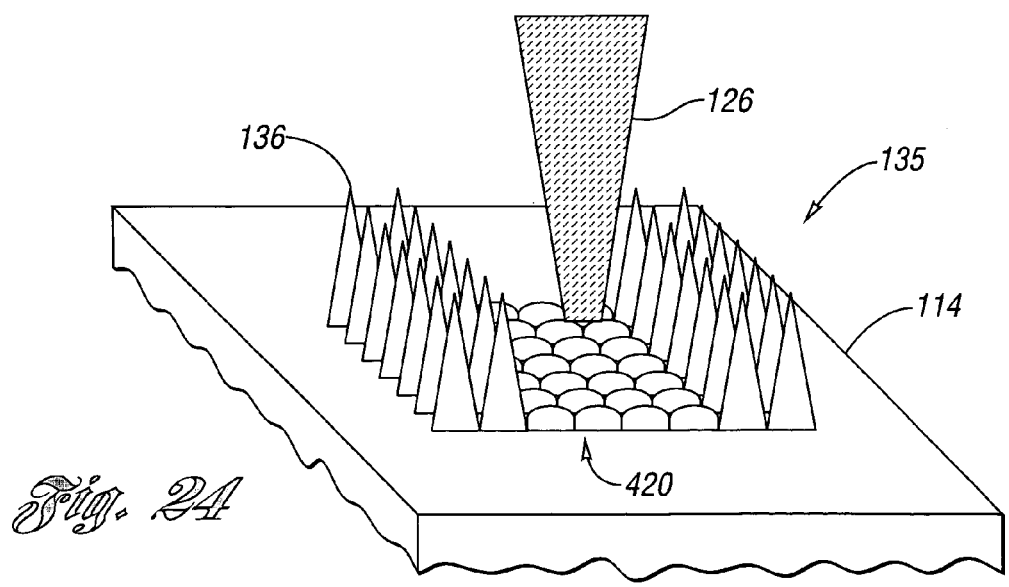
FIG. 24 illustrates removing material, for instance, modifying a microtextured pattern, using a secondary processing beam corresponding, for example, to FIG. 2.

FIG. 24 shows a microtextured area that is modified at 420 with secondary irradiation 126. The operations to produce the microtextured region may be carried out within a system as illustrated in FIG. 14, or at a different location in the manufacturing process.

Figure 20:
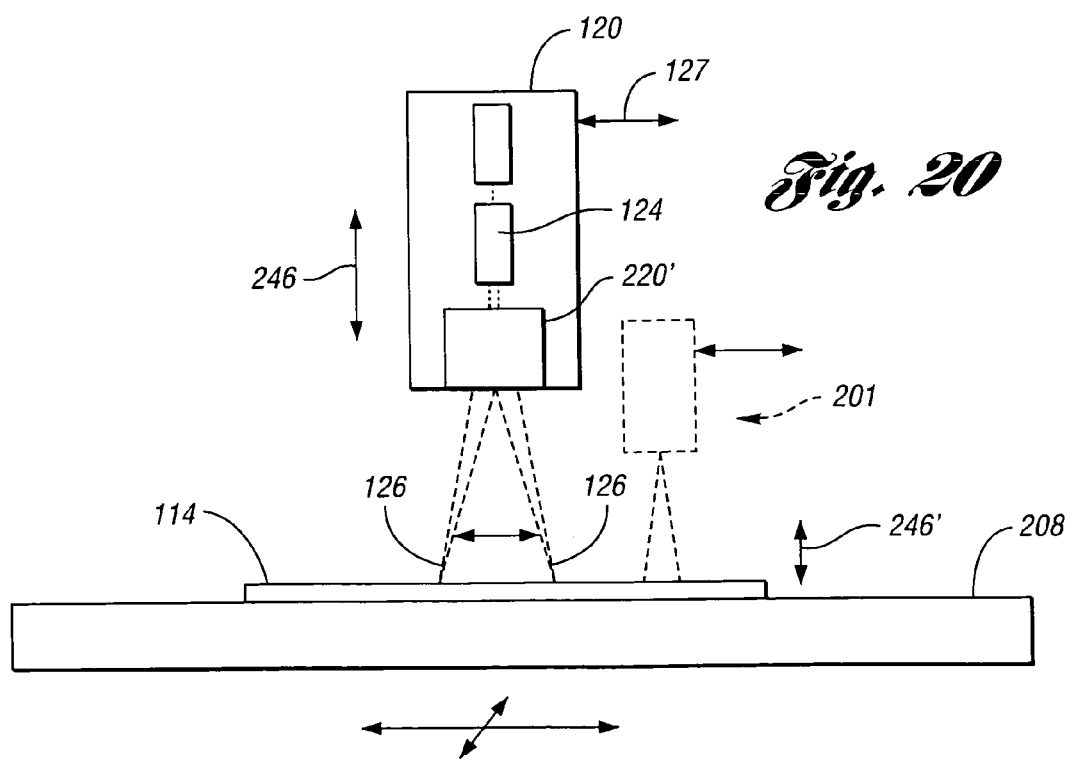
FIG. 20 is a schematic block diagram, similar to FIG. 16, showing some elements of a semiconductor wafer processing system, specifically, elements related to secondary processing of FIG. 2.

FIGS. 2 and 20 illustrate several components which may be used in a secondary processing system and these system components may be similar or identical to those used in the ultrafast system. The laser 120 generates the secondary processing beam. A beam positioning system, which may correspond to any suitable arrangement of optical or mechanical beam positioners, delivers and focuses the secondary processing beam 126 onto a microtextured area of a workpiece. The secondary laser energy is absorbed by the microtexture. The microtexture is heated and the increased temperature is sufficient to cause a phase change in the material.

The secondary processing laser 120 may be a YAG or CO2 laser. Preferably, the laser 120 is selected to minimize damage to non-microtextured areas. Most preferably, the laser beam 126 is transmitted through the non-microtextured material. For example, if the material is silicon the preferred wavelength may be about 1.2 microns (e.g., using a Raman laser) where the silicon transmission is generally maximized. Alternatively, a commercially available 1.32 micron laser may also be nearly optimum, and such lasers are widely available.

The beam positioning system may include one or more stages 208 for moving the workpiece relative to the processing beam, in an arrangement similar or identical to FIG. 20. The beam positioning system may include a beam scanner 240,242 to move the beam relative to the workpiece and a focusing lens. The specific choice of components and other features (e.g., lens coating) will generally depend on the laser wavelength, spot size requirements, damage threshold considerations, etc.

The beam positioning system may include a combination of two or more stages and scanners to move the processing beam relative to the workpiece in at least two axes. The beam positioner may position the beam waist relative to the workpiece through movement 246 of one or more optical elements within the secondary laser system. The beam positioning system may move the beam waist relative to the workpiece in at least three axes. The beam positioning system may move the beam waist relative to the workpiece in at least three axes using various combinations of movement of optical system components with z-axis translation 246' using, for example, a motorized wafer chuck assembly.

The microtextured area may be formed according to an embodiment of the current invention, but is not restricted to ultrashort laser processing. Generally, the microtextured area is to decrease the reflection coefficient of the workpiece material.

The irradiated material may be ablated from the surface to remove the absorbing structure. The irradiated material may be melted and recast to form an area with modified properties.

Figure 25:
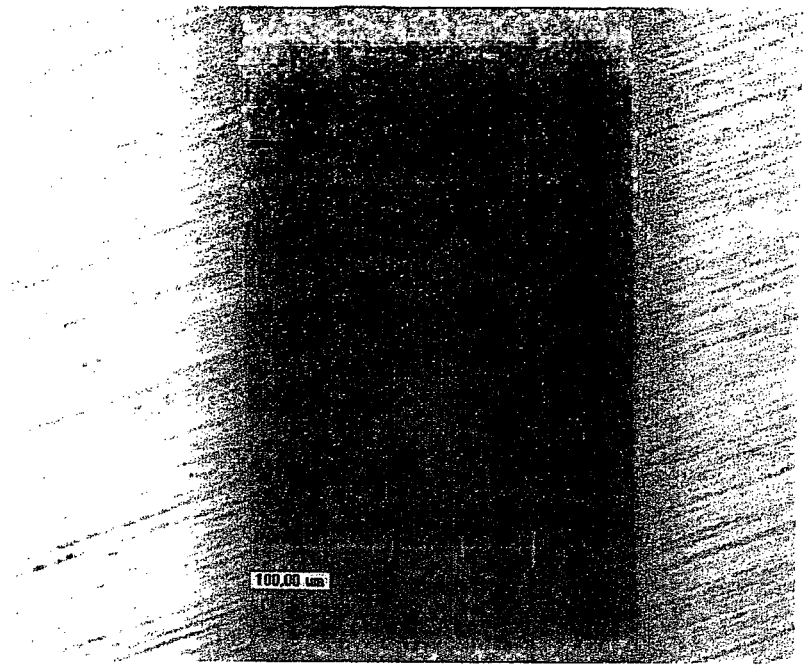

For microtexture formed on materials with a transmission band, it is preferred to select a laser wavelength in the transmission band which is absorbed into the microtexture. In this way, the properties of the microtextured material can be modified and the properties of adjacent material can be left unchanged. The secondary beam may have a wavelength which corresponds to maximum transmission through the non-textured material. For example, if the non-textured region is also silicon, the secondary beam may have a wavelength beyond the absorption edge of silicon, for instance greater than 1.2 microns. If the non-textured material is glass, the wavelength may be in the visible or near IR region. In some applications it may be desirable to use a laser that is absorbed in the microtexture and the adjacent material marks on silicon substrates having ground, polished, or smooth surfaces. Laser and system parameters for some marked regions are as follows:

FIG. 25
Grinded silicon wafer (with good mark);
Marking condition:
Wavelength 532 nm;
Repetition rate 30 KHz;
Average power 460 mw;
15 µj pulse energy;
Linear mark speed 100 mm/sec;
Line width 115 µm;
Energy density 0.15 J/cm$^2$;
Peak power density 10$^{10}$ W/cm$^2$;
Overlap: 34.

Figure 26:
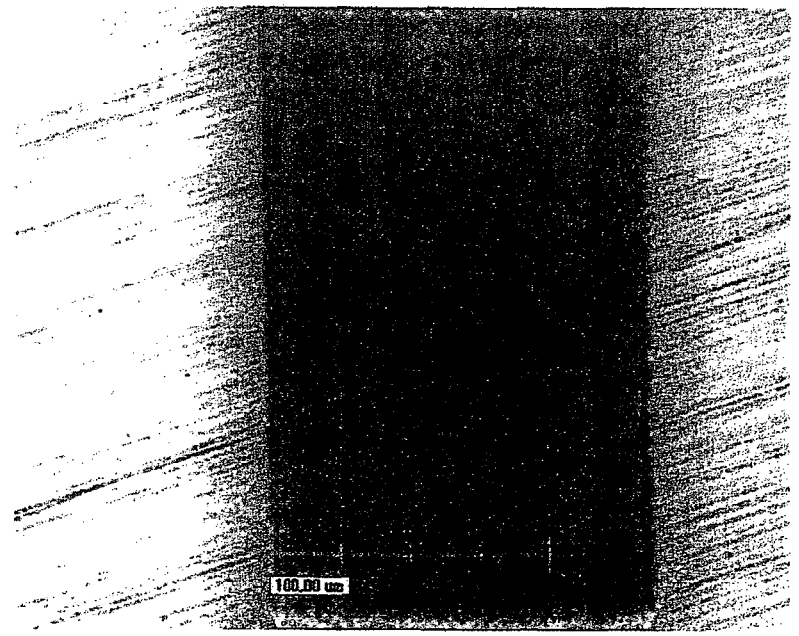

FIG. 26
Grinded silicon wafer;
Marking condition:
Wavelength 532 nm;
Repetition rate 30 KHz;
Average power 500 mw;
16.3 µj pulse energy;
Linear mark speed 100 mm/sec;
Line width 140 µm;
Energy density 0.16 J/cm$^2$.

Figure 27:
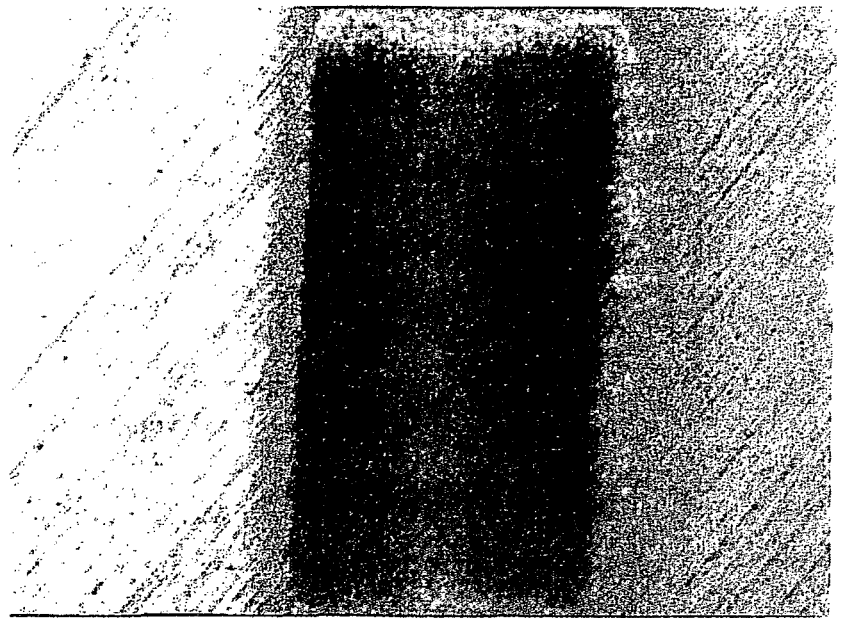

FIG. 27
Grinded silicon wafer;
Marking condition:
Wavelength 532 nm;
Repetition rate 30 KHz;
Average power 300 mw;
9.8 µj pulse energy;
Linear mark speed 16.6 mm/sec;
Energy density 0.1 J/cm$^2$.

Figure 28:
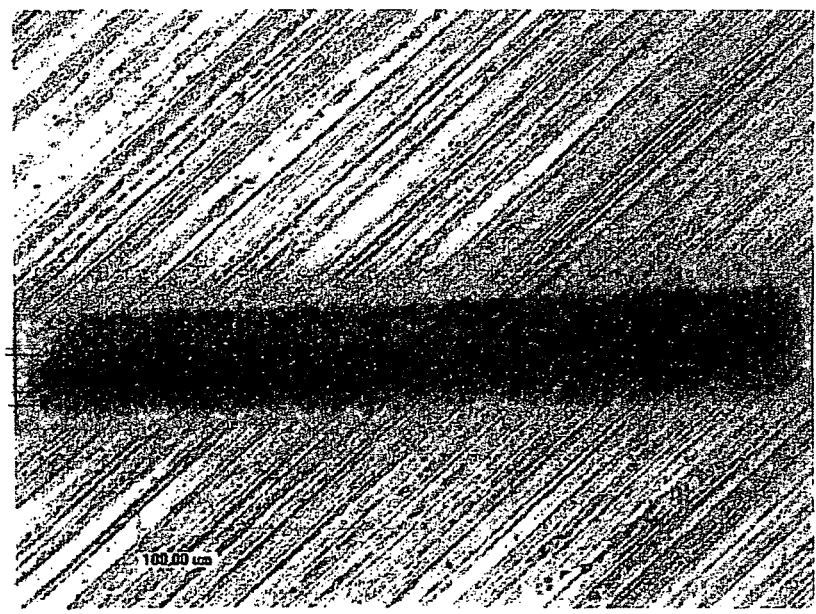

FIG. 28
Grinded silicon wafer (with good mark);
Marking condition:
Wavelength 532 nm;
Repetition rate 30 KHz;
Average power 100 mw;
3.3 µj pulse energy;
Linear mark speed 100 mm/sec;
Line width 40 µm;
Energy density 0.26 J/cm$^2$;
Peak power density 1.7×10$^{10}$ W/cm$^2$.

Figure 29:
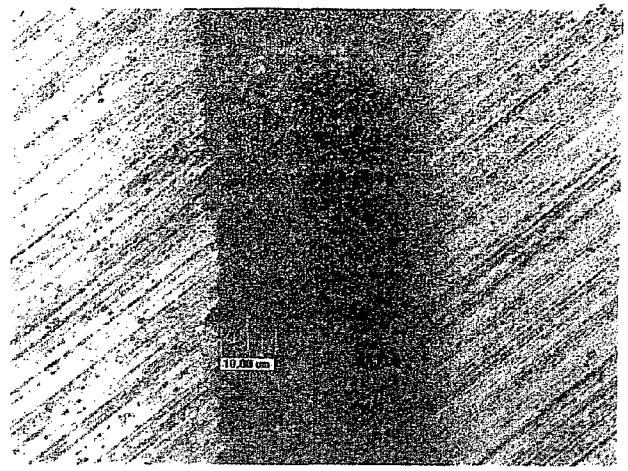

FIG. 29
Polished silicon wafer (with good mark);
Marking condition:
Wavelength 532 nm;
Repetition rate 30 KHz;
Average power 100 mw;
3.3 µj pulse energy;
Linear mark speed 100 mm/sec;
Line width 40 µm;
Energy density 0.26 J/cm$^2$;
Peak power density 1.7×10$^{10}$ W/cm$^2$.

Figure 30A:
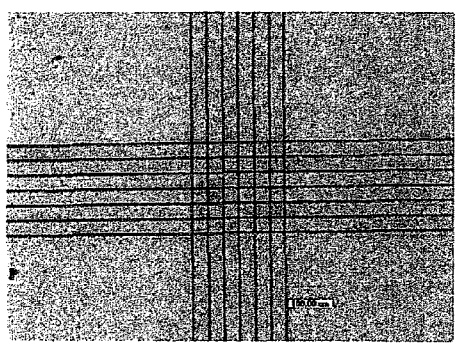
Figure 30B:
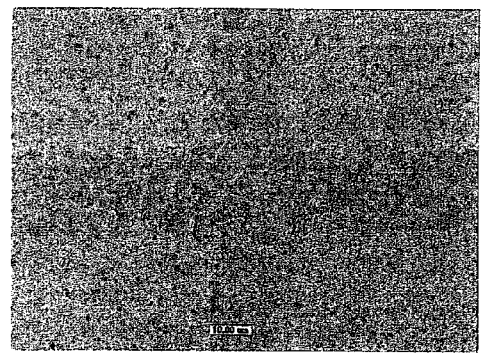

FIGS. 30a and 30b
Silicon wafer (with mark on specular surface);
Marking condition:
Wavelength 532 nm;
Repetition rate 30 KHz;
Average power 7.2 mw;
0.24 µj pulse energy;
Linear mark speed 100 mm/sec;
Line width 8 µm;
Energy density 0.12 J/cm$^2$;
Peak power density 0.8×10$^{10}$ W/cm$^2$.

Marking Examples

Figure 31A:
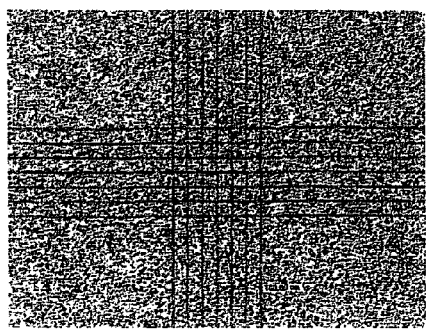
Figure 31B:
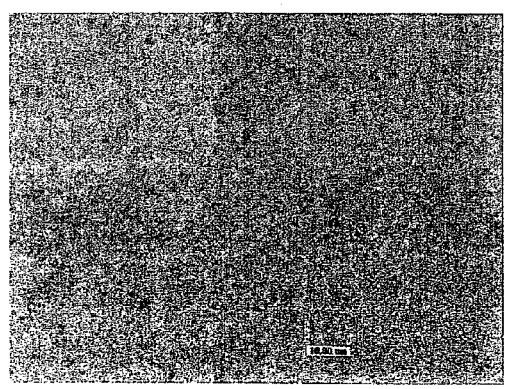

Each of FIGS. 25 to 36 relates to actual results obtained using a commercially available picosecond laser to form FIGS. 31a and 31b
Silicon wafer (with mark on rough surface);
Marking condition:
Wavelength 532 nm;
Repetition rate 30 KHz;
Average power 7.2 mw;
0.24 μj pulse energy;
Linear mark speed 100 mm/sec;
Line width 8 μm;
Energy density 0.12 J/cm$^2$;
Peak power density 0.8×10$^{10}$ W/cm$^2$.

Figure 32A:
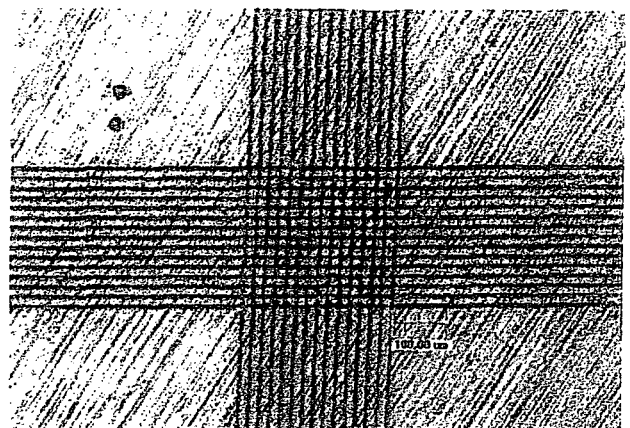
Figure 32B:
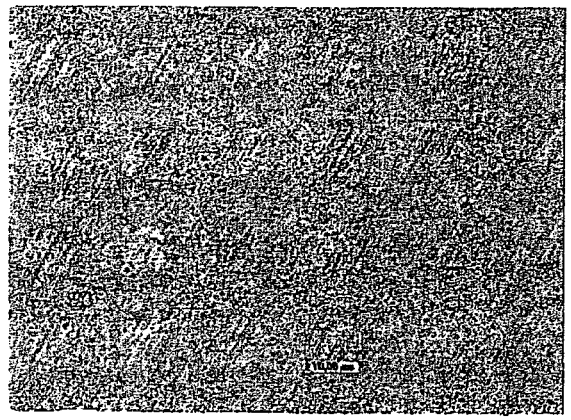
Figure 32C:
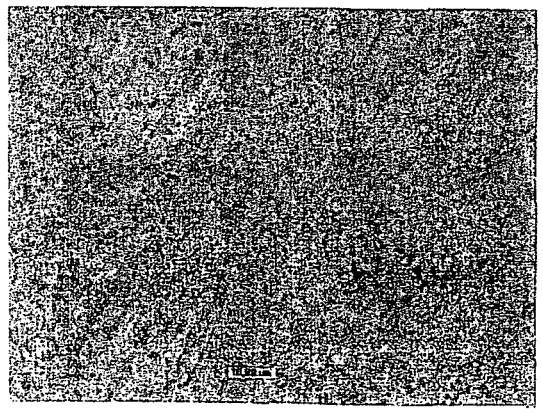

FIGS. 32a, 32b and 32c
Silicon wafer (with 15 line mark within 0.28 mm);
Marking condition:
Wavelength 532 nm;
Repetition rate 30 KHz;
Average power 7.2 mw;
0.24 μj pulse energy;
Linear mark speed 100 mm/sec;
Line width 8 μm;
Energy density 0.12 J/cm$^2$;
Peak power density 0.8×10$^{10}$ W/cm$^2$.

The samples were mounted on X-Y stage, and the mark linewidth was varied by adjustment of a combination of the optical system and incident laser energy, the adjustments controlling the energy density incident on the material.

The images of the marked material samples were taken using a "through the lens" (brightfield) microscope system and CCD camera. Various regions were profiled using either a SEM (scanning electron microscope) or AFM (atomic force microscope). Certain marks were also compared with marks formed using a nanosecond laser system. The number of pulses corresponding to a particular linewidth can be computed from the pulse repetition rate, linewidth, and table speed. For instance, FIG. 25 corresponds to 34 applied pulses during stage travel corresponding to the linewidth of 115 μm.

The listed laser parameters and results are to be regarded as exemplary rather than limiting. The laser parameters may be optimized or adjusted based on various process conditions, surface roughness figures, presence/absence of coatings, etc. Various refinements and adjustments may provide for further improvements in contrast and density.

Generally, the linewidth corresponds to an effective spot size on the surface wherein the fluence is at or above an approximate ablation threshold of silicon. Hence, if a greater fraction of the spot is above the ablation threshold the linewidth increases. For example, if the spot profile is diffraction limited and Gaussian and the region above threshold corresponds to the FWHM, then the nominal kerf width will be approximately the FWHM.

Also, as a result of a nearly constant fluence threshold for a specific material, larger linewidths, larger spots, generally require more laser energy than small linewidths.

The laser used in the experiments and general laser system specifications are as follows:
Commercial pico-second laser from Lumera Laser, Model Staccato;
Primary specifications:
Pulse width 15 ps;
Wavelength 532 nm;
Repetition rate 30 KHz;
Average power (see attached results);
Linear polarization;
M-squared less than 1.2.

It is noted that whenever linear polarization is used the direction of stage travel was aligned perpendicular to the polarization direction.

FIGS. 25, 26 and 27 show marks formed on a ground silicon substrate, exemplified by the grind direction (as opposed to uniform, specular background). FIGS. 26 and 27 provide a rough test of the "process energy window" which represent the energy range over which acceptable processing is achieved. The larger linewidth (140 microns) in FIG. 26 corresponds to a larger fraction of the focused spot diameter above the ablation threshold. A slight heat-affected zone (HAZ) is shown in the regions where melting occurs, though insignificant. Undesirable slag, debris, or severely melted zones are absent.

FIGS. 28 and 29 show parameters and results where a 40 micron linewidth was produced in the X and Y directions, respectively. The polarization was perpendicular to the direction of travel.

FIGS. 30a, 30b, 31a, 31b, 32a, 32b and 32c illustrate improved mark density and a clearly resolved pattern within a 0.3 mm (0.28 mm) region, a result which demonstrates capability to form finer indicia than available in current, commercially-available, laser marking systems. FIG. 30a and 30b correspond to a specular wafer background (smooth finish), FIGS. 31a and 31b correspond to a rough back-side wafer surface, and FIGS. 32a, 32b and 32c correspond to a polished wafer. The enlarged photos provide some local additional detail, the definition and sharpness reduction believed to be caused by various limitations in the setup, for instance the camera dynamic range, the high N.A. of the microscope collecting additional scattered light, and other factors. The high contrast images correspond to the approximate magnification to be used by a typical mark reader/inspection system.

Figure 33A:
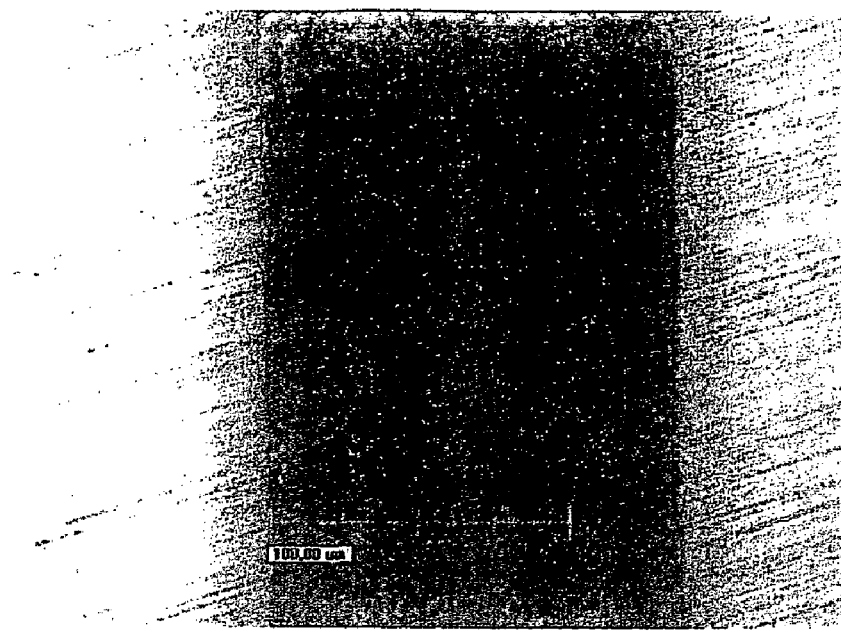
Figure 33B:
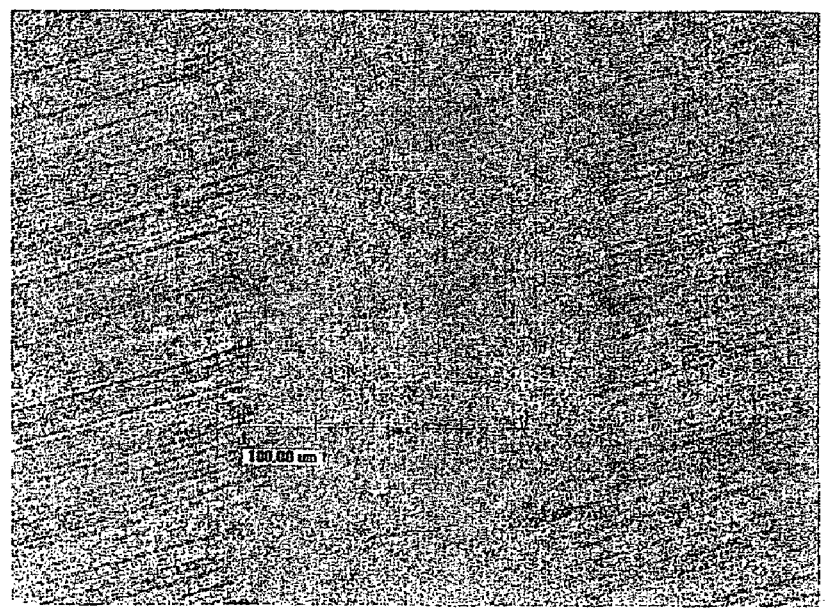

FIGS. 33a and 33b compare a high contrast mark obtained with the picosecond system (i.e., FIG. 33a) with a mark formed with a typical nanosecond laser-based marking system (i.e., FIG. 33b). The nanosecond "dark" mark surface roughness is not significantly altered, whereas the microtexture is formed only within the picosecond mark.

Figure 34A:
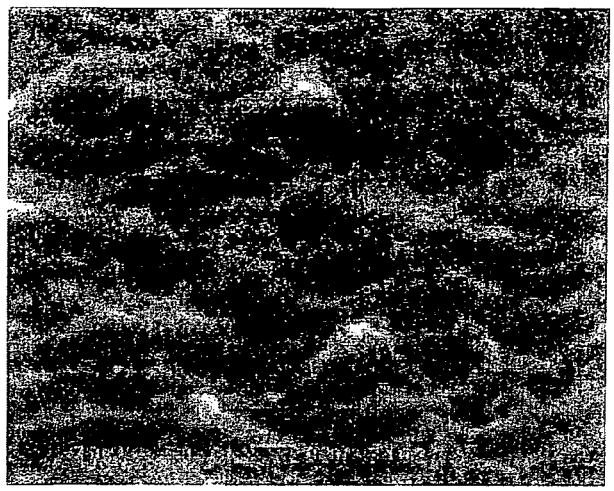
Figure 34B:
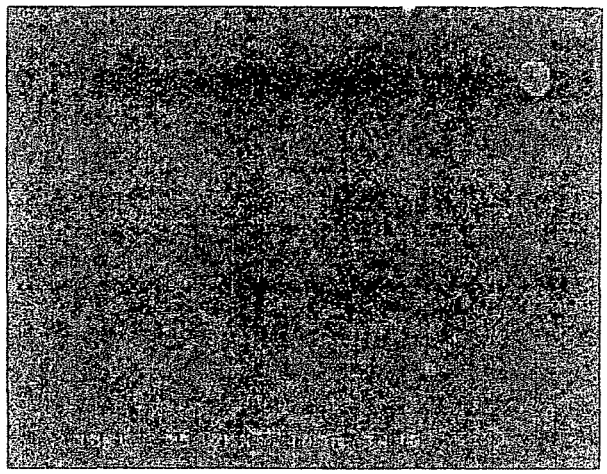
Figure 34C:
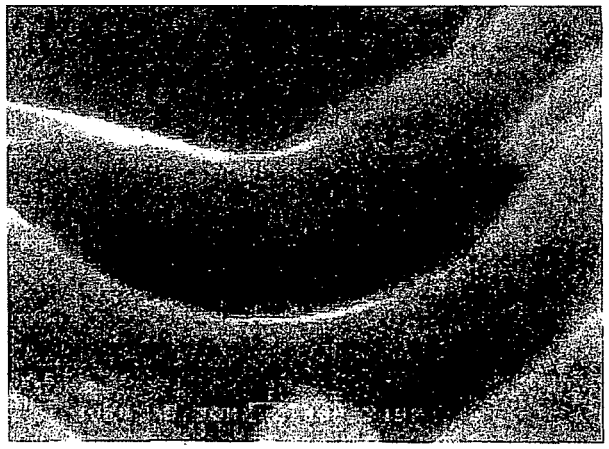

FIGS. 34a, 34b and 34c show SEM images of the marked regions further demonstrating the presence of the microtexture produced with the picosecond system as follows:
FIG. 34a
SEM of mark by ps laser;
Submicron structures seen.
FIG. 34b
SEM of dark mark by ns laser;
No structure seen.
FIG. 34c
SEM of white mark by ns laser;
Larger ridge structure seen.

The nanosecond results show only insignificant roughness ("dark mark" case), the surface roughness variations evident with the picosecond results were not detected in the nanosecond data—neither the "dark" or "hard" marks show the microtexture. The deep marks (traditional "hard marks") also show highly undesirable ridge formations. Of significance is an observation that even for "dark" nanosecond marks (which are relatively shallow compared to "hard marks"), the microtexture is not detected in the images corresponding to the nanosecond marking.

Figure 35:
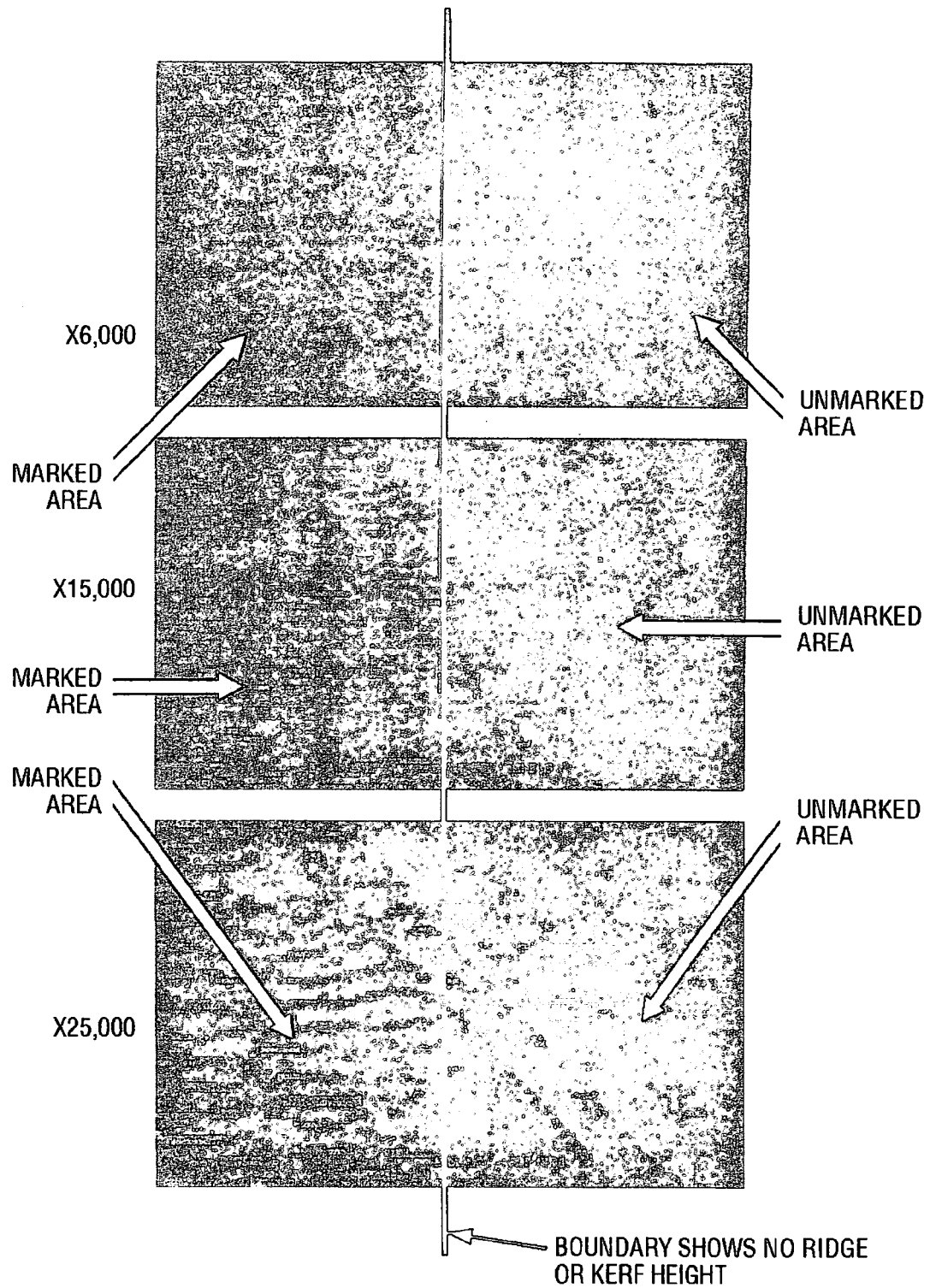
Figure 36:
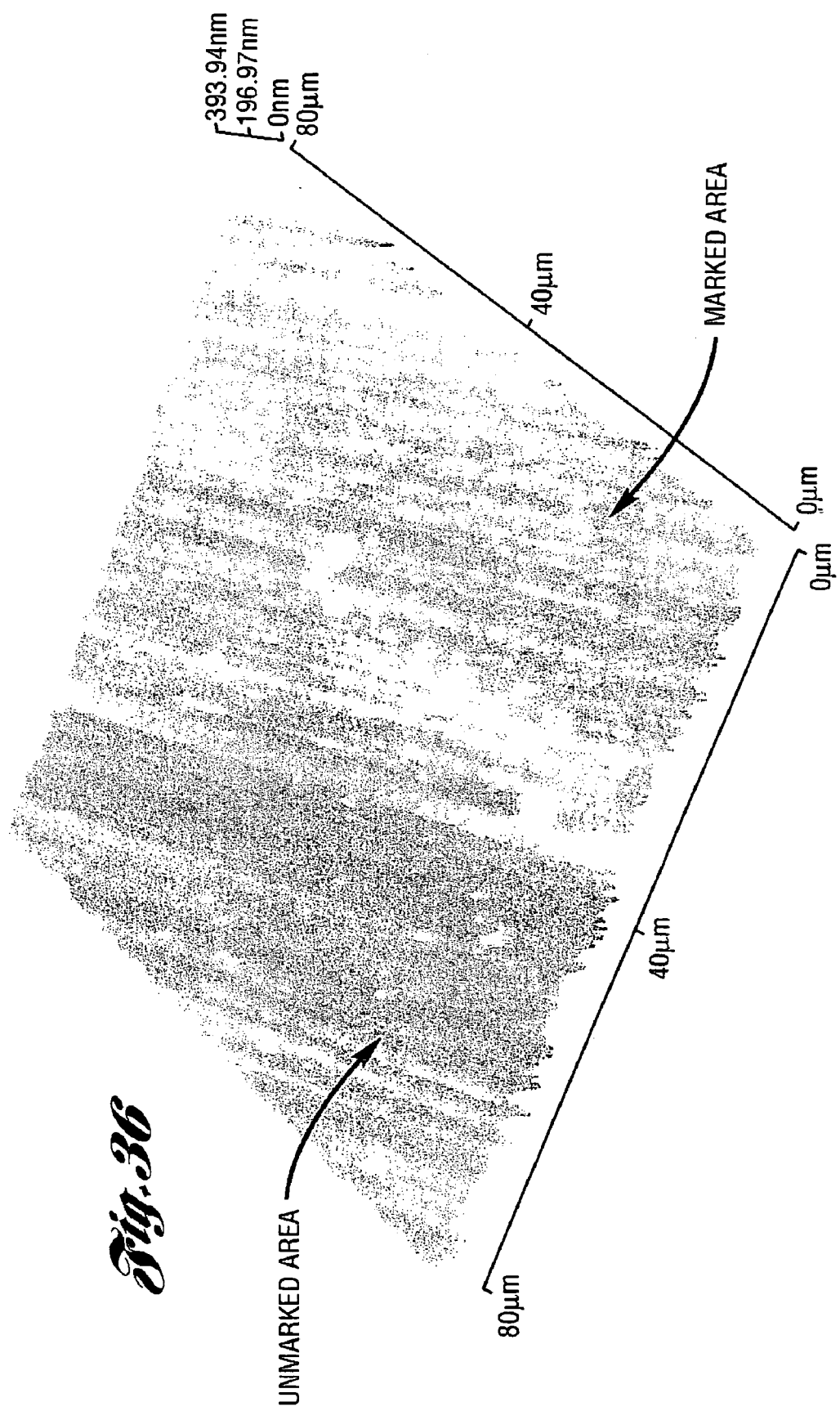
Figure 37A:
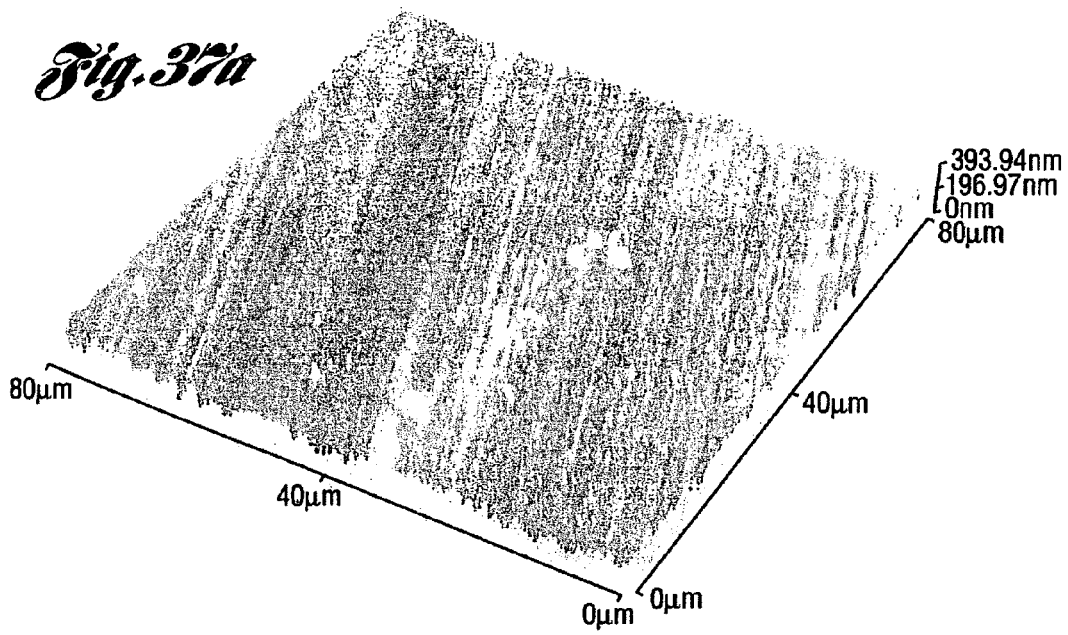
Figure 37B:
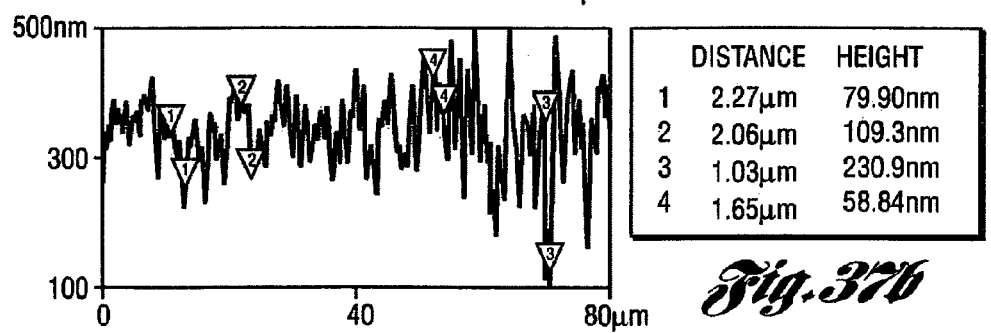
Figure 37C:
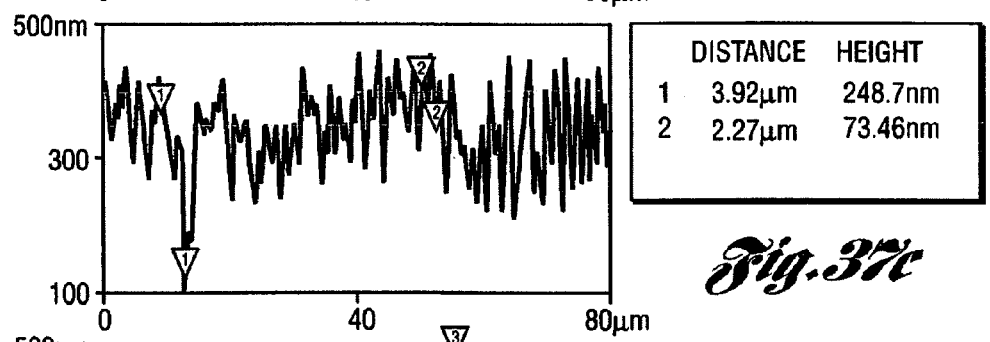
Figure 37D:
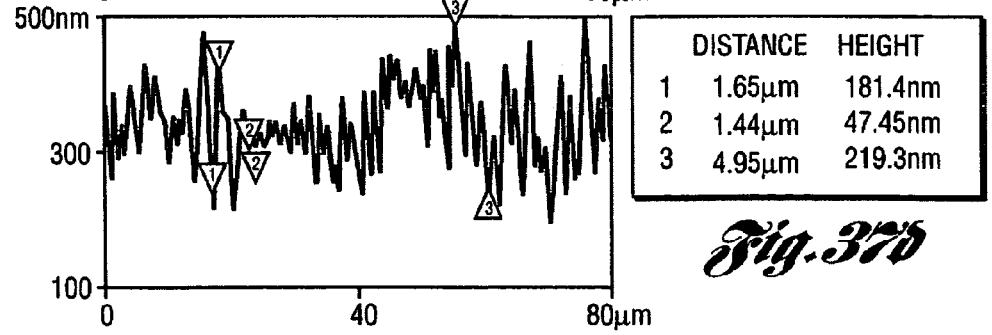

FIG. 35 shows SEM images obtained from a marked region of a polished wafer. A surface region is shown at three SEM magnifications: 15,000X, 6,000X, and 25,000X. The texture boundary between the marked and unmarked region is evident, even with the polished background variations. Further, the marked region, its periphery, and the polished background are all slag-free—ridges and kerf height negligible.

FIGS. 36, 37a, 37b, 37c and 37d show measurement of a marked region of a polished wafer using an AFM to measure surface heights. Sub-micron structures are evident, with peak heights in the range of tens to hundreds of nanometers. The polished background regions correspond to the semi-specular, strong directional reflectance results shown in earlier figures. A very high contrast is achievable for specular wafer backgrounds providing for clear recognition of textured and non-marked specular wafer regions. In such a case, the indicia may also be clearly distinguished from the background using AFM or SEM measurements which will exemplify the difference in texture.

The examples generally show marked regions which have roughness greater than a reflective background. By way of example, it is also possible to form positive contrast indicia by forming a background which is microtextured, wherein the indicia are highly reflective, and configuring the lighting so that the indicia have positive contrast relative to a dark background. This example may be of interest if, for example, the system throughput is not degraded (or is improved) using the technique (e.g., wherein the total area of the indicia is to be greater than the background area). Further, certain applications may require such "reverse contrast" as part of customer specifications. Other similar variations and alternatives can be carried out without departing from the scope and spirit of the present invention.

Laser Embodiments

The commercially available laser used to produce the high contrast results of the above working example includes a mode locked oscillator and a diode pumped solid-state laser amplifier. Picosecond outputs are available with pulse parameters within a desired range. The choice of a laser system is generally based upon the requirements for pulse energy, repetition rate, average power, pulse width required to irradiate the material to be marked with total energy density sufficient to initiate ablation within the spatial spot size on the material surface. Useful laser wavelengths include near IR, visible (e.g., 532 nm), and ultraviolet. Other factors include size, cost, reliability, and various practical considerations for use in semiconductor production environment, for example. An "off-the-shelf" solution is desirable when available. Preferably, the laser system is compatible with available marking equipment, for instance the commercially soft-mark type of wafer marking system such as the GSI Lumonics WaferMark SigmaClean.

Published U.S. patent application No. 2004/0134894 entitled "Laser-based System for Memory Link Processing with Picosecond Lasers," is assigned to the assignee of the present invention and is hereby incorporated in its entirety herein. Included therein are various exemplary picosecond laser systems which may be used or modified for use in one or more embodiments of the present invention. Of particular interest are: the section entitled "Picosecond Laser Embodiments", FIGS. 6a-8e, and the corresponding portions of the published application.

Published U.S. patent application No. 2004/0226925 entitled "Laser System and Method for Material Processing with Ultra Fast Lasers," is assigned to the assignee of the present invention and is hereby incorporated in its entirety herein. Included therein are various exemplary femtosecond laser systems which may be used or modified for use in one or more embodiments of the present invention. Of particular interest are: the section entitled "Ultrashort Laser Embodiments," FIGS. 1-8, and the corresponding portions of the published application.

By way of example, the laser systems of the above-noted incorporated patent applications may be modified for use at shifted wavelengths (e.g., green and UV). The system output, for instance average power and peak energy, may be adjusted to meet the energy density requirements with reduction or increase or amplifier gain as needed to process at a required energy density.

Ongoing developments are expected to lead to increased commercial availability. For example, FCPA system (Fiber based Chirped Pulse Amplification) reported by IMRA America includes 2 microjoules of pulse energy at a repetition rate of 500 KHz, corresponding to 1W average power operation at femtosecond pulse widths.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for processing targeted surface material within a region of a workpiece while avoiding undesirable changes to adjacent non-targeted material, the method comprising:
generating a pulsed laser output including at least one pulse having a wavelength and a pulse width;
irradiating the targeted surface material of the workpiece with the pulsed laser output including the at least one pulse to texture the targeted surface material, the pulsed laser output having sufficient total fluence to initiate ablation within at least a portion of the targeted surface material and the pulse width being short enough such that the region and non-targeted material surrounding the region are substantially free of defects;
generating a secondary laser output; and
irradiating the textured surface material with the secondary laser output to process the textured surface material wherein the textured surface material comprises indicia and wherein at least a portion of the indicia are erased during the step of irradiating with the secondary laser output and wherein the defects include slag, debris, and microcracking.

2. The method as claimed in claim 1, wherein the processing is one of micro-joining, micro-actuating, and micro-assembling.

3. The method as claimed in claim 1, wherein the targeted surface material is at least one of a semiconductor substrate, a thin film, a metal layer and a dielectric layer.

4. The method as claimed in claim 1, wherein the workpiece is one of a circuit bearing die, a MEMs device, an optoelectronic device and a biomedical chip.

5. The method as claimed in claim 1, wherein the indicia are machine-readable and wherein the indicia have a font size less than 0.3 mm.

6. The method as claimed in claim 1, wherein processing the textured surface material comprises forming a microtextured pattern and wherein the pattern is one of a bar pattern, a matrix pattern, an alphanumeric character string, and a logotype.

7. The method as claimed in claim 1, wherein the pulse width of the at least one pulse is below about 1 ns.

8. The method as claimed in claim 7, wherein the pulse width is about 100 ps or less.

9. The method as claimed in claim 7, wherein the pulse width is between 15 fs and 50 ps.

10. The method as claimed in claim 7, wherein the wavelength of the at least one pulse is 0.532 microns.

11. The method as claimed in claim 1, wherein the step of irradiating the targeted surface material includes the step of directing the laser output in response to at least one control signal that represents the indicia to impinge the region at a first location.

12. The method as claimed in claim 11, wherein the step of irradiating the targeted material includes the step of focusing the laser output to obtain a laser spot.

13. The method as claimed in claim 12, wherein the laser spot is a shaped spot having has a top-hat irradiance profile.

14. The method as claimed in claim 12, wherein the laser spot is a shaped spot having a depressed center with energy concentrated in a perimeter of the shaped spot.

15. The method as claimed in claim 1, wherein the step of irradiating the targeted surface material substantially increases surface roughness and optical contrast of the targeted surface material within at least a portion of the region.

16. The method as claimed in claim 1, wherein the non-targeted surface material surrounding the region has a surface with a strong specular reflection component.

17. The method as claimed in claim 1, wherein diffuse reflectance of the indicia is in a range of 0.5% to 5%.

18. The method as claimed in claim 1, wherein the total fluence exceeds about 0.1 J/cm$^2$.

19. The method as claimed in claim 1, wherein the wavelength is less than an absorption edge of the targeted surface material.

20. The method as claimed in claim 1, wherein the wavelength is ultraviolet.

21. The method as claimed in claim 1, wherein the targeted surface material is a semiconductor, a metal or a dielectric.

22. The method as claimed in claim 21, wherein the targeted surface material is polished or ground silicon.

23. The method as claimed in claim 21, wherein the targeted surface material is a portion of a dielectric passivation layer and wherein the dielectric of the layer is an inorganic, organic, or a low-k dielectric.

24. The method as claimed in claim 1, wherein the textured surface material of the indicia has surface height variations in a range of about 0.25 microns to about 1 micron.

25. The method as claimed in claim 1, wherein a feature dimension of the indicia is in a range of several microns to tens of microns.

26. The method as claimed in claim 1, wherein a feature dimension of the indicia is a few times the wavelength of the at least one pulse.

27. The method as claimed in claim 1, wherein the step of irradiating the targeted material includes the step of controlling polarization of the pulsed laser output relative to a direction of travel to enhance or control a characterization of the textured surface material.

28. The method as claimed in claim 1, wherein a negative window mark is created during the step of irradiating with the secondary laser output.

29. The method as claimed in claim 1, wherein the textured surface material comprises a pattern and wherein the step of irradiating with the secondary laser output micromachines the pattern.

30. The method as claimed in claim 1, wherein the step of irradiating with the secondary laser output trims an electrical or mechanical parameter of the textured surface material.

31. The method as claimed in claim 1, wherein the secondary laser output includes at least one pulse having a wavelength which is absorbed into the textured surface material.

32. The method as claimed in claim 31, wherein the wavelength of the at least one pulse of the secondary beam is also absorbed into the non-targeted material surrounding the region.

33. The method as claimed in claim 31, wherein the wavelength of the at least one pulse of the secondary beam is not absorbed into the non-targeted material surrounding the region.

34. The method as claimed in claim 1, wherein the step of irradiating the textured surface material comprises at least one of phase changing, melting, depth controlled ablating, and recasting the textured surface material.

35. The method as claimed in claim 1, wherein a boundary of the textured surface material is evident as a kerf edge between targeted surface material and adjacent non-targeted material wherein a transition at the kerf edge has negligible kerf height or ridges.

36. The method as claimed in claim 1, wherein targeted surface material is silicon and the secondary laser output has a wavelength transmitted through the non-microtextured material that is about 1.2 or 1.32 microns.

37. A method for processing targeted surface material within a region of a workpiece while avoiding undesirable changes to adjacent non-targeted material, the method comprising:
generating a pulsed laser output including at least one pulse having a wavelength and a pulse width;
irradiating the targeted surface material of the workpiece with the pulsed laser output including the at least one pulse to texture the targeted surface material, the pulsed laser output having sufficient total fluence to initiate ablation within at least a portion of the targeted surface material and the pulse width being short enough such that the region and non-targeted material surrounding the region are substantially free of slag;
generating a secondary laser output; and
irradiating the textured surface material with the secondary laser output to process the textured surface material wherein the textured surface material comprises indicia and wherein a negative window mark is created during the step of irradiating with the secondary laser output.

38. The method as claimed in claim 37, wherein the negative window mark comprises a microtextured pattern and wherein the pattern is one of a bar pattern, a matrix pattern, an alphanumeric character string and a logotype.

39. The method as claimed in claim 37, wherein the targeted surface material is at least one of a semiconductor substrate, a thin film, a metal layer and a dielectric layer.

40. The method as claimed in claim 37, wherein the workpiece is one of a MEMs device, an optoelectronic device and a biomedical chip.

41. The method as claimed in claim 37, wherein the indicia are machine-readable and wherein the indicia have a font size less than 0.3 mm.

42. The method as claimed in claim 37, wherein the textured surface material comprises a microtextured pattern and wherein the pattern is one of a bar pattern, a matrix pattern, an alphanumeric character string, and a logotype.

43. The method as claimed in claim 37, wherein the pulse width of the at least one pulse is below about 1 ns.

44. The method as claimed in claim 37, wherein the pulse width is about 100 ps or less.

45. The method as claimed in claim 37, wherein the step of irradiating includes the steps of measuring total fluence over a spatial dimension of a spot of the output and directing the laser output in response to at least one control signal that represents a first location of at least a part of the indicia to impinge the region at the first location.

46. The method as claimed in claim 37, wherein the step of irradiating substantially increases surface roughness of the targeted surface material within at least a portion of the region.

47. The method as claimed in claim 37, wherein the non-targeted surface material surrounding the region has a surface with a strong specular reflection component.

48. The method as claimed in claim 37, wherein diffuse reflectance of the indicia is in a range of 0.5% to 5%.

49. The method as claimed in claim 37, wherein the total fluence exceeds about 0.1 J/cm$^2$.

50. The method as claimed in claim 37, wherein the wavelength is less than an absorption edge of the targeted surface material.

51. The method as claimed in claim 50, wherein the wavelength is ultraviolet.

52. The method as claimed in claim 37, wherein the targeted surface material is silicon.

53. The method as claimed in claim 37, wherein the targeted surface material is a metal or a dielectric.

54. The method as claimed in claim 37, wherein the targeted surface material is a portion of a dielectric passivation layer and wherein the dielectric of the layer is an inorganic, organic, or a low-k dielectric.

55. The method as claimed in claim 37, wherein the targeted surface material is part of a MEM device.

56. The method as claimed in claim 37, wherein a portion of the indicia has surface variations in a range of about 0.25 microns to about 1 micron.

57. The method as claimed in claim 37, wherein a feature dimension of the indicia is in a range of several microns to tens of microns.

58. The method as claimed in claim 37, wherein a feature dimension of the indicia is a few wavelengths of the at least one pulse.

59. The method as claimed in claim 37, wherein the step of irradiating includes the step of controlling polarization of the pulsed laser output to enhance or control a characterization of the textured surface material.

60. The method as claimed in claim 45, wherein the step of irradiating includes the step of shaping the spot to obtain a shaped spot.

61. The method as claimed in claim 60, wherein the shaped spot has a top-hat irradiance profile.

62. The method as claimed in claim 60, wherein the shaped spot has a depressed center with energy concentrated in a perimeter of the shaped spot.

63. The method as claimed in claim 37, wherein the pulsed laser output coarsely textures the targeted surface material and the secondary laser output finely processes the textured surface material.

64. The method as claimed in claim 37, wherein the textured surface material comprises a pattern and wherein the step of irradiating with the secondary laser output micromachines the pattern.

65. The method as claimed in claim 37, wherein the step of irradiating with the secondary laser output trims an electrical or mechanical parameter of the textured surface material.

66. The method as claimed in claim 37, wherein the secondary laser output includes at least one pulse having a wavelength which is absorbed into the textured surface material.

67. The method as claimed in claim 66, wherein the wavelength of the at least one pulse of the secondary beam is also absorbed into the non- targeted material surrounding the region.

68. The method as claimed in claim 66, wherein the wavelength of the at least one pulse of the secondary beam is not absorbed into the non- targeted material surrounding the region.

69. A method for processing targeted surface material within a region of a workpiece while avoiding undesirable changes to adjacent non-targeted material, the method comprising:
generating a pulsed laser output including at least one pulse having a wavelength and a pulse width;
irradiating the targeted surface material of the workpiece with the pulsed laser output including the at least one pulse to texture the targeted surface material, the pulsed laser output having sufficient total fluence to initiate ablation within at least a portion of the targeted surface material and the pulse width being short enough such that the region and non-targeted material surrounding the region are substantially free of slag wherein the pulse width is less than 10 picoseconds
generating a secondary laser output; and
irradiating the textured surface material with the secondary laser output to process the textured surface material wherein the textured surface material comprises indicia and wherein the indicia are erased during the step of irradiating with the secondary laser output.

70. The method as claimed in claim 69, wherein the indicia is at least semi-permanent or erasable.

71. The method as claimed in claim 69, wherein the targeted surface material is at least one of a semiconductor substrate, a thin film, a metal layer and a dielectric layer.

72. The method as claimed in claim 69, wherein the workpiece is one of a MEMs device, an optoelectronic device and a biomedical chip.

73. The method as claimed in claim 69, wherein the textured surface material comprises a microtextured pattern and wherein the pattern is one of a bar pattern, a matrix pattern, an alphanumeric character string, and a logotype.

74. The method as claimed in claim 73, wherein the indicia are machine-readable and wherein the indicia have a font size less than 0.3 mm.

75. The method as claimed in claim 69, wherein the step of irradiating the targeted surface material includes the step of directing the laser output in response to at least one control signal that represents a first location of at least a part of the indicia to impinge the region at the first location.

76. The method as claimed in claim 75, wherein the step of irradiating the targeted surface material includes the step of shaping the spot to obtain a shaped spot.

77. The method as claimed in claim 76, wherein the shaped spot has a top-hat irradiance profile.

78. The method as claimed in claim 76, wherein the shaped spot has a depressed center with energy concentrated in a perimeter of the shaped spot.

79. The method as claimed in claim 69, wherein the step of irradiating the targeted surface material substantially increases surface roughness of the targeted surface material within at least a portion of the region.

80. The method as claimed in claim 69, wherein the non-targeted surface material surrounding the region has a surface with a strong specular reflection component.

81. The method as claimed in claim 69, wherein diffuse reflectance of the indicia is in a range of 0.5% to 5%.

82. The method as claimed in claim 69, wherein the total fluence exceeds about 0.1 J/cm$^2$.

83. The method as claimed in claim 69, wherein the wavelength is less than an absorption edge of the targeted surface material.

84. The method as claimed in claim 69, wherein the wavelength is ultraviolet.

85. The method as claimed in claim 69, wherein the targeted surface material is silicon.

86. The method as claimed in claim 69, wherein the targeted surface material is a metal or a dielectric.

87. The method as claimed in claim 69, wherein the targeted surface material is a portion of a dielectric passivation layer and wherein the dielectric of the layer is an inorganic, organic, or a low-k dielectric.

88. The method as claimed in claim 69, wherein the targeted surface material is part of a MEM device.

89. The method as claimed in claim 69, wherein a portion of the indicia has surface variations in a range of about 0.25 microns to about 1 micron.

90. The method as claimed in claim 69, wherein a feature dimension of the indicia is in a range of several microns to tens of microns.

91. The method as claimed in claim 69 wherein a feature dimension of the indicia is a few wavelengths of the at least one pulse.

92. The method as claimed in claim 69, wherein the step of irradiating the targeted surface material includes the step of controlling polarization of the pulsed laser output to enhance or control a characterization of the textured surface material.

93. The method as claimed in claim 69, wherein the pulsed laser output finely textures the targeted surface material and the secondary laser output coarsely processes the textured surface material.

94. The method as claimed in claim 69, wherein the pulsed laser output coarsely textures the targeted surface material and the secondary laser output finely processes the textured surface material.

95. The method as claimed in claim 69, wherein the textured surface material comprises a pattern and wherein the step of irradiating with the secondary laser output micromachines the pattern.

96. The method as claimed in claim 69, wherein the step of irradiating with the secondary laser output trims an electrical or mechanical parameter of the textured surface material.

97. The method as claimed in claim 69, wherein the secondary laser output includes at least one pulse having a wavelength which is absorbed into the textured surface material.

98. The method as claimed in claim 97, wherein the wavelength of the at least one pulse of the secondary beam is also absorbed into the non-targeted material surrounding the region.

99. The method as claimed in claim 97, wherein the wavelength of the at least one pulse of the secondary beam is not absorbed into the non-targeted material surrounding the region.

100. A method for processing targeted surface material within a region of a workpiece while avoiding undesirable changes to adjacent non-targeted material, the method comprising:

generating a pulsed laser output including at least one pulse having a wavelength and a pulse width;

irradiating the targeted surface material of the workpiece with the pulsed laser output including the at least one pulse to texture the targeted surface material, the pulsed laser output having sufficient total fluence to initiate ablation within at least a portion of the targeted surface material and the pulse width being short enough such that the region and non-targeted material surrounding the region are substantially free of slag wherein the pulse width is less than 10 picoseconds:

generating a secondary laser output; and irradiating the textured surface material with the secondary laser output to process the textured surface material wherein the textured surface material comprises indicia and wherein a negative window mark is created during the step of irradiating with the secondary laser output.

* * * * *

UNITED STATES PATENT AND TRADEMARK OFFICE
CERTIFICATE OF CORRECTION

| | |
|---|---|
| PATENT NO. | : 7,469,831 B2 |
| APPLICATION NO. | : 11/514660 |
| DATED | : December 30, 2008 |
| INVENTOR(S) | : Bo Gu et al. |

It is certified that error appears in the above-identified patent and that said Letters Patent is hereby corrected as shown below:

Column 23, Line 10, Claim 13:

Delete "has".

Signed and Sealed this

Twenty-fourth Day of February, 2009

JOHN DOLL
*Acting Director of the United States Patent and Trademark Office*